United States Patent
Trussell et al.

(10) Patent No.: US 9,502,275 B1
(45) Date of Patent: Nov. 22, 2016

(54) SERVICE TUNNEL FOR USE ON CAPITAL EQUIPMENT IN SEMICONDUCTOR MANUFACTURING AND RESEARCH FABS

(71) Applicant: Lam Research Corporation, Fremont, CA (US)

(72) Inventors: David Trussell, Fremont, CA (US);
John Daugherty, Fremont, CA (US);
Michael Kellogg, Fremont, CA (US);
Christopher Pena, Fremont, CA (US);
Richard Gould, Fremont, CA (US);
Klay Kunkel, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 14/887,876

(22) Filed: Oct. 20, 2015

(51) Int. Cl.
*H01L 21/67* (2006.01)
*H01L 21/677* (2006.01)

(52) U.S. Cl.
CPC ... *H01L 21/67703* (2013.01); *H01L 21/67155* (2013.01); *H01L 21/67167* (2013.01)

(58) Field of Classification Search
CPC .................. H01L 21/67155; H01L 21/67161; H01L 21/67005; H01L 21/67011; H01L 21/67167; H01L 21/67703; H01L 21/67173
See application file for complete search history.

(56) References Cited

U.S. PATENT DOCUMENTS

| | | | | |
|---|---|---|---|---|
| 6,235,634 B1 * | 5/2001 | White | ............... | H01L 21/67161 118/715 |
| 6,277,199 B1 * | 8/2001 | Lei | ..................... | C23C 14/568 118/696 |
| 6,663,332 B1 * | 12/2003 | Sluijk | ............... | H01L 21/67769 414/160 |
| 6,857,841 B2 * | 2/2005 | Lering | ..................... | B62B 3/10 414/396 |
| 7,740,437 B2 * | 6/2010 | De Ridder | ........ | H01L 21/67769 414/217.1 |
| 8,070,410 B2 * | 12/2011 | Rebstock | ............... | B65G 37/02 414/217 |
| 8,870,513 B2 * | 10/2014 | Voser | ................. | H01L 21/67201 198/608 |
| 9,147,591 B2 * | 9/2015 | Kobayashi | ........ | H01L 21/67173 |
| 9,312,153 B2 * | 4/2016 | Hiroki | ............... | H01L 21/67161 |
| 2002/0090283 A1 * | 7/2002 | Kisakibaru | ........ | H01L 21/67017 414/271 |
| 2009/0191030 A1 * | 7/2009 | Bluck | .................. | C23C 14/568 414/217 |
| 2013/0343844 A1 * | 12/2013 | Fosnight | .............. | B65G 1/0464 414/281 |
| 2015/0086302 A1 * | 3/2015 | Senzaki | ............ | H01J 37/32091 414/222.13 |
| 2015/0249029 A1 * | 9/2015 | Sharrock | ........... | H01L 21/67173 414/217 |

* cited by examiner

*Primary Examiner* — Kaitlin Joerger
(74) *Attorney, Agent, or Firm* — Martine Penilla Group, LLP

(57) ABSTRACT

A system for processing substrates is provided, comprising: a wafer transport assembly that is configured to transport wafers to and from one or more process modules, the wafer transport assembly having at least one wafer transport module, wherein lateral sides of the at least one wafer transport module are configured to couple to the one or more process modules; a service floor defined below the wafer transport assembly, the service floor being defined at a height that is less than a height of a fabrication facility floor in which the system is disposed.

17 Claims, 17 Drawing Sheets

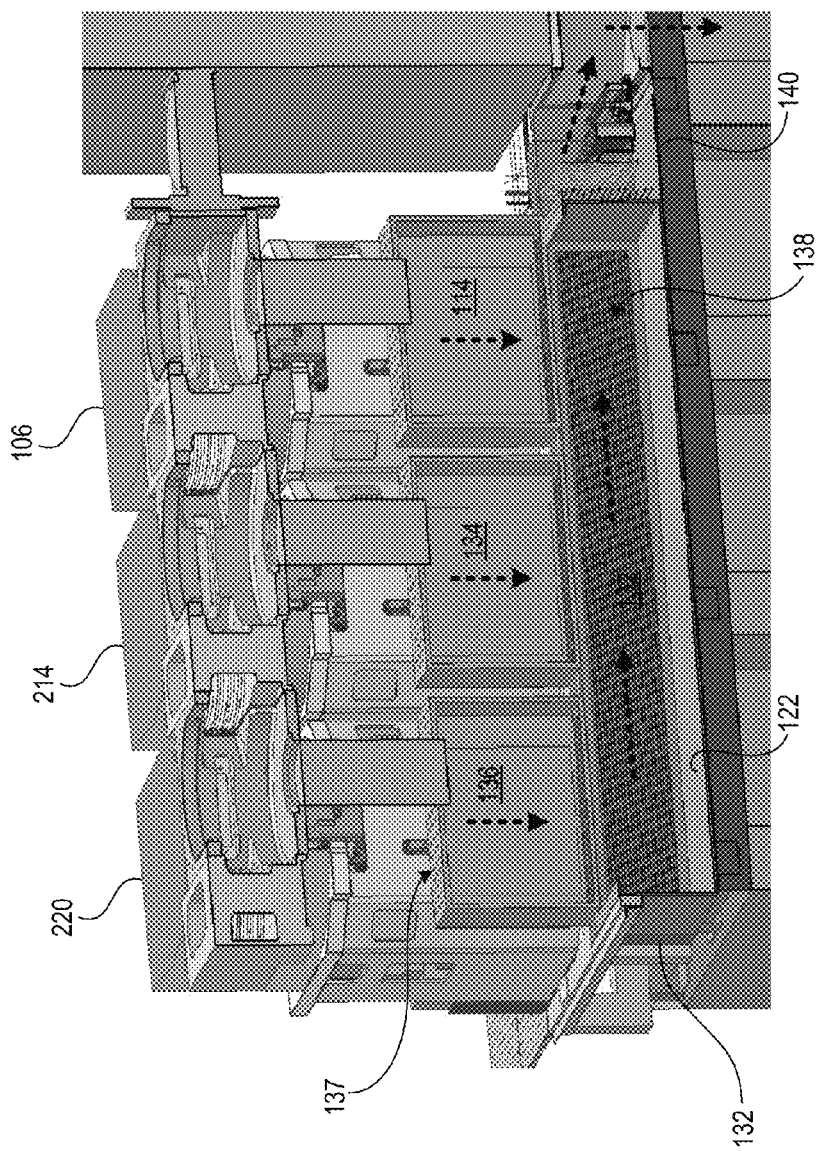

SERVICE TUNNEL FOR USE ON CAPITAL EQUIPMENT IN SEMICONDUCTOR MANUFACTURING AND RESEARCH FABS

BACKGROUND

1. Field of the Invention

The present embodiments relate to semiconductor wafer processing equipment, and more particularly, to multi-chamber process tool systems, apparatus, and associated methods.

2. Description of the Related Art

In a semiconductor fabrication facility (commonly referred to as a "fab") space is limited and expensive, and cannot be readily increased. Therefore, efficient space utilization is desired in order to achieve maximum productivity. However, it is also necessary to provide adequate access to equipment in the fab for maintenance and service.

It is in this context that embodiments of the inventions arise.

SUMMARY

Implementations of the disclosure provide methods, apparatus, and systems relating to a compact cluster tool architecture. The architecture includes a service tunnel defined below a wafer transport assembly, the service tunnel leveraging a subfloor space that is below the level of the fabrication facility floor. Also, the wafer transport assembly can include a number buffers that are positioned to achieve a compact footprint and which provide flexibility for configuring wafer movement through the wafer transport assembly.

In accordance with implementations of the disclosure, a cluster tool system for processing wafers is provided, comprising: a wafer transport assembly extending along a longitudinal axis of the cluster tool system, the wafer transport assembly having a front end oriented towards an equipment front end module (EFEM), the wafer transport assembly having a rear end opposite the front end; at least two process modules coupled to the wafer transport assembly along a first lateral side of the wafer transport assembly, the wafer transport assembly being configured to transport wafers to and from the at least two process modules coupled along the first lateral side; at least two process modules coupled to the wafer transport assembly along a second lateral side of the wafer transport assembly, the wafer transport assembly being configured to transport wafers to and from the at least two process modules coupled along the second lateral side; a service tunnel defined underneath the wafer transport assembly, the service tunnel extending along the longitudinal axis of the cluster tool system from the front end to the rear end of the wafer transport assembly, the service tunnel having a vertical dimension defined between an underside of the wafer transport assembly and a service floor that is positioned underneath the wafer transport assembly, the service floor being defined at a height that is less than a height of a fabrication facility floor in which the cluster tool system is disposed.

In some implementations, the wafer transport assembly includes at least two wafer transport modules that are coupled to each other along the longitudinal axis, wherein each of the wafer transport modules couples to one of the process modules that is coupled along the first lateral side of the wafer transport assembly, and wherein each of the wafer transport modules couples to one of the process modules that is coupled along the second lateral side of the wafer transport assembly.

In some implementations, the cluster tool system further includes: at least two process module frames configured to support the at least two process modules coupled along the first lateral side of the wafer transport assembly, and further configured to rest on the fabrication facility floor; at least two process module frames configured to support the at least two process modules coupled along the second lateral side of the wafer transport assembly, and further configured to rest on the fabrication facility floor.

In some implementations, a stair set is defined at a rear end of the service tunnel that is defined substantially underneath the rear end of the wafer transport assembly, the stair set configured to define a path from the fabrication floor down to the service floor.

In some implementations, the height of the service floor is approximately 1 feet (30.5 cm) to 2 feet (61 cm) below the height of the fabrication facility floor.

In some implementations, the front side of the wafer transport assembly is configured for connection to a load lock that controls access to and from the EFEM, wherein a front end of the service tunnel extends substantially to the EFEM.

In some implementations, a height of the service tunnel is approximately 6 feet (183 cm) to 8 feet (244 cm).

In some implementations, a first lateral side of the service tunnel provides access to the process modules coupled along the first lateral side of the wafer transport assembly, and a second lateral side of the service tunnel provides access to the process modules coupled along the second lateral side of the wafer transport assembly.

In some implementations, the first lateral side of the service tunnel provides access to one or more gas boxes defined for the process modules coupled along the first lateral side of the wafer transport assembly, and the second lateral side of the service tunnel provides access to one or more gas boxes defined for the process modules coupled along the second lateral side of the wafer transport assembly.

In some implementations, the service tunnel is compliant with SEMI E72 standards.

In accordance with implementations of the disclosure, a cluster tool system for processing wafers is provided, including: a wafer transport assembly extending along a longitudinal axis of the cluster tool system, the wafer transport assembly having a front end oriented towards an equipment front end module (EFEM), the wafer transport assembly having a rear end opposite the front end; at least two process modules coupled to the wafer transport assembly along a first lateral side of the wafer transport assembly, the wafer transport assembly being configured to transport wafers to and from the at least two process modules coupled along the first lateral side; at least two process modules coupled to the wafer transport assembly along a second lateral side of the wafer transport assembly, the wafer transport assembly being configured to transport wafers to and from the at least two process modules coupled along the second lateral side; a service tunnel defined underneath the wafer transport assembly, the service tunnel extending along the longitudinal axis of the cluster tool system from the front end to the rear end of the wafer transport assembly, the service tunnel having a vertical dimension defined between an underside of the wafer transport assembly and a service floor that is positioned underneath the wafer transport assembly, the service floor being defined at a height that is less than a height of a fabrication facility floor in which the cluster tool system is disposed, wherein the height of the service floor is approximately 1 feet (30 cm) to 2 feet (60 cm) below the height of the fabrication facility floor; at least two process module frames configured to support the at least two process modules coupled along the first lateral side of the wafer transport assembly, and further configured to rest on the fabrication facility floor; at least two process module frames configured to support the at least two process modules coupled along the second lateral side of the wafer transport assembly, and further configured to rest on the fabrication facility floor; wherein a height of the service tunnel is defined by the height of the service floor and a height of the process module frames, the height of the service tunnel being approximately 6 feet (180 cm) to 8 feet (240 cm).

In some implementations, the wafer transport assembly includes at least two wafer transport modules that are coupled to each other along the longitudinal axis, wherein each of the wafer transport modules couples to one of the process modules that is coupled along the first lateral side of the wafer transport assembly, and wherein each of the wafer transport modules couples to one of the process modules that is coupled along the second lateral side of the wafer transport assembly.

In some implementations, a stair set is defined at a rear end of the service tunnel that is defined substantially underneath the rear end of the wafer transport assembly, the stair set configured to define a path from the fabrication floor down to the service floor.

In some implementations, the front side of the wafer transport assembly is configured for connection to a load lock that controls access to and from the EFEM, wherein a front end of the service tunnel extends substantially to the EFEM.

In some implementations, a first lateral side of the service tunnel provides access to the process modules coupled along the first lateral side of the wafer transport assembly, and a second lateral side of the service tunnel provides access to the process modules coupled along the second lateral side of the wafer transport assembly.

In some implementations, the first lateral side of the service tunnel provides access to one or more gas boxes defined for the process modules coupled along the first lateral side of the wafer transport assembly, and the second lateral side of the service tunnel provides access to one or more gas boxes defined for the process modules coupled along the second lateral side of the wafer transport assembly.

In some implementations, the service tunnel is compliant with SEMI E72 standards.

In accordance with implementations of the disclosure, a wafer transport assembly is provided, including: a first wafer transport module; a second wafer transport module; a buffer module coupled between the first and second wafer transport modules, such that the first wafer transport module, the second wafer transport module, and the buffer module are aligned in a single directional axis, the buffer module having a first buffer stack and a second buffer stack, wherein the first buffer stack is positioned at a first lateral end of the buffer module disposed on a first side of the single directional axis, and wherein the second buffer stack is positioned at a second lateral end of the buffer module disposed on a second side of the single directional axis; wherein a first side of the first wafer transport module disposed on the first side of the single directional axis is configured to couple to a first process module; wherein a first side of the second wafer transport module disposed on the first side of the single directional axis is configured to couple to a second process module; wherein the first lateral end of the buffer module defines a first side protrusion that is nested between the first and second wafer transport modules and the first and second process modules; wherein a second side of the first wafer transport module disposed on the second side of the single directional axis is configured to couple to a third process module; wherein a second side of the second wafer transport module disposed on the second side of the single directional axis is configured to couple to a fourth process module; wherein the second lateral end of the buffer module defines a second side protrusion that is nested between the first and second wafer transport modules and the third and fourth process modules; wherein the first wafer transport module, the second wafer transport module, and the buffer module are configured to define a continuous controlled environment.

In some implementations, the wafer transport assembly is configured to define a transport path for a wafer from one of the first or third process modules, to the first wafer transport module, to one of the first or second buffer stacks, to the second wafer transport module, to one of the second or fourth process modules.

In some implementations, each of the first and second buffer stacks is configured to store approximately 5 to 10 wafers.

In some implementations, the controlled environment is defined by a vacuum controlled environment.

In some implementations, the first and second buffer stacks define a plurality of wafer storage slots, wherein at least one of the wafer storage slots is configured to store a cover wafer in the controlled environment defined by the wafer transport assembly.

In some implementations, the wafer transport assembly further includes: a second buffer module coupled to the second transport module and aligned along the single directional axis, the second buffer module having a third buffer stack positioned at a first lateral end of the second buffer module disposed on the first side of the single directional axis, the second buffer module having a fourth buffer stack positioned at a second lateral end of the second buffer module disposed on the second side of the single directional axis.

In some implementations, the first lateral end of the second buffer module defines a third side protrusion, and wherein the second lateral end of the second buffer module defines a fourth side protrusion.

In some implementations, the wafer transport assembly further includes: a third wafer transport module coupled to the second buffer module and aligned along the single directional axis, wherein a first side of the third wafer transport module disposed on the first side of the single directional axis is configured to couple to a fifth process module, and wherein a second side of the third wafer transport module disposed on the second side of the single directional axis is configured to couple to a sixth process module.

In some implementations, the third side protrusion is nested between the second and third wafer transport modules and the second and fifth process modules; and wherein the fourth side protrusion is nested between the second and third wafer transport modules and the fourth and sixth process modules.

In some implementations, the wafer transport assembly is defined over a service tunnel that extends from a front end of the wafer transport assembly to a rear end of the wafer transport assembly.

In accordance with implementations of the disclosure, a wafer transport assembly is provided, including: a housing; a first wafer transport robot disposed within the housing; a second wafer transport robot disposed within the housing;

first and second buffer stacks disposed within the housing, wherein the first and second buffer stacks are positioned between the first and second wafer transport robots; wherein a first interface is defined along a first side of the housing and configured to couple to a first process module; wherein a second interface is defined along the first side of the housing and configured to couple to a second process module; wherein a first side protrusion is defined along the first side of the housing between the first and second interfaces, the first side protrusion defining a location for the first buffer stack and being nested between the first and second wafer transport robots and the first and second process modules; wherein a third interface is defined along a second side of the housing and configured to couple to a third process module; wherein a fourth interface is defined along the second side of the housing and configured to couple to a fourth process module; wherein a second side protrusion is defined along the second side of the housing between the third and fourth interfaces, the second side protrusion defining a location for the second buffer stack and being nested between the first and second wafer transport robots and the third and fourth process modules; wherein the wafer transport assembly defines a continuous controlled environment.

In some implementations, the wafer transport assembly is configured to define a transport path for a wafer from one of the first or third process modules, to the first wafer transport robot, to one of the first or second buffer stacks, to the second wafer transport robot, to one of the second or fourth process modules.

In some implementations, the wafer transport assembly further includes: a connector for coupling to a vacuum source, wherein the continuous controlled environment is defined by a vacuum controlled environment.

In some implementations, an upper portion of the first buffer stack defines a first plurality of wafer storage slots, the upper portion of the first buffer stack having one or more separators defined between each of the first plurality of wafer storage slots; and wherein a lower portion of the first buffer stack defines a second plurality of wafer storage slots, the lower portion of the first buffer stack having no separators defined between each of the second plurality of wafer storage slots.

In some implementations, the lower portion of the first buffer stack is configured to store one or more cover wafers or seasoning wafers.

In some implementations, each of the first and second buffer stacks is configured to store approximately 5 to 10 wafers.

In some implementations, the wafer transport assembly is defined over a service tunnel that extends from a front end of the wafer transport assembly to a rear end of the wafer transport assembly.

In accordance with implementations of the disclosure, a load lock assembly is provided, including: a first load lock configured for connection between an equipment front end module (EFEM) and a wafer transport module, the EFEM being maintained at a lab ambient condition, the wafer transport module being maintained at a vacuum condition, the wafer transport module being part of a wafer transport assembly that is configured to transport wafers to and from one or more process modules that are connected to the wafer transport assembly; a second load lock disposed over the first load lock, the second load lock configured for connection between the EFEM and the wafer transport module; a post-processing module disposed over the second load lock, the post-processing module configured for performing a post-processing operation on a processed wafer that has been processed in at least one of the process modules that are connected to the wafer transport assembly, the post-processing module being configured for connection to the wafer transport module.

In some implementations, the post-processing module is stacked over the second load lock, and wherein the second load lock is stacked over the first load lock.

In some implementations, the first load lock is configured for movement of wafers from the EFEM into the wafer transport module; wherein the second load lock is configured for movement of wafers from the wafer transport module to the EFEM.

In some implementations, the post-processing module is configured to perform a strip process or a passivation process on the processed wafer.

In some implementations, the load lock assembly further includes: a third load lock disposed adjacent to the first load lock, the third load lock configured for connection between the EFEM and the wafer transport module; a fourth load lock disposed over the third load lock and adjacent to the second load lock, the fourth load lock configured for connection between the EFEM and the wafer transport module; a second post-processing module disposed over the fourth load lock, the second post-processing module configured for performing a post-processing operation on a processed wafer, the second post-processing module being configured for connection to the wafer transport module.

In some implementations, the second post-processing module is stacked over the fourth load lock, and wherein the fourth load lock is stacked over the third load lock.

In some implementations, the first and second load locks are configured for movement of wafers from the EFEM into the wafer transport module; wherein the third and fourth load locks are configured for movement of wafers from the wafer transport module into the EFEM.

In accordance with implementations of the disclosure, a system is provided, including: an equipment front end module (EFEM); a wafer transport assembly, the wafer transport assembly including a wafer transport module configured for connection to a first process module and a second process module, the wafer transport module including a robot for moving wafers to and from the first and second process modules; a first load lock and a second load lock connected between the EFEM and a front side of the wafer transport module, the first and second load locks being configured for movement of wafers from the EFEM to the wafer transport module; a third load lock and a fourth load lock connected between the EFEM and a front side of the wafer transport module, the third and fourth load locks being configured for movement of wafers from the wafer transport module to the EFEM.

In some implementations, the first and second load locks are positioned in a stacked configuration; wherein the third and fourth load locks are positioned in a stacked configuration adjacent to the first and second load locks.

In some implementations, the system further includes: a first post-processing module connected to the front side of the wafer transport module, the first post-processing module configured to perform a post-processing operation on a processed wafer; a second post-processing module connected to the front side of the wafer transport module, the second post-processing module configured to perform a post-processing operation on a processed wafer.

In some implementations, the first or second process module is configured to perform an etch operation, and wherein the first or second post-processing module is configured to perform a strip operation after performance of the etch operation.

In some implementations, the robot is configured to transfer a wafer from the first load lock to the first process module for performance of the etch operation, then transfer the wafer from the first process module to the first post-processing module for performance of the strip operation, then transfer the wafer from the first post-processing module to the third load lock to exit the wafer transport assembly.

In accordance with implementations of the disclosure, a method for processing a wafer is provided, including: transporting a wafer from an equipment front end module (EFEM), through a first load lock, into a wafer transport assembly, the first load lock being connected between the EFEM and the wafer transport assembly; moving the wafer into a process module that is configured to perform a process operation on the wafer, the process module being connected to the wafer transport assembly; after performance of the process operation, moving the wafer into a post-processing module configured for performing a post-processing operation on the wafer, wherein the post-processing module is connected to the wafer transport assembly and arranged in a vertically stacked configuration with the first load lock; after performance of the post-processing operation, moving the wafer from the post-processing module, through a second load lock that is connected to the wafer transport assembly, to the EFEM, the second load lock being connected between the EFEM and the wafer transport assembly.

In some implementations, the process operation is an etch operation, and wherein the post-processing operation is a strip operation.

In some implementations, the second load lock is arranged in a vertically stacked configuration with the first load lock.

In some implementations, the second load lock is positioned adjacent to the vertically stacked configuration defined by the first load lock and the passivation module.

BRIEF DESCRIPTION OF THE DRAWINGS

FIG. 1F illustrates a cut-away view of a cluster tool for processing wafers, in accordance with implementations of the disclosure.

DESCRIPTION

Implementations of the disclosure provide methods, apparatus, and systems relating to a cluster tool architecture that achieves a compact footprint with SEMI-compliant access space in the form of a service tunnel defined below a wafer transport assembly. The wafer transport assembly further may include several buffers which are maintained in the same controlled environment (e.g. a vacuum condition) as the rest of the wafer transport assembly, and which provide great flexibility for configuring wafer movement through the wafer transport assembly. It should be appreciated that the present embodiments can be implemented in numerous ways, such as a process, an apparatus, a system, a device, a material, or a method. Several embodiments are described below.

Figure 1A:
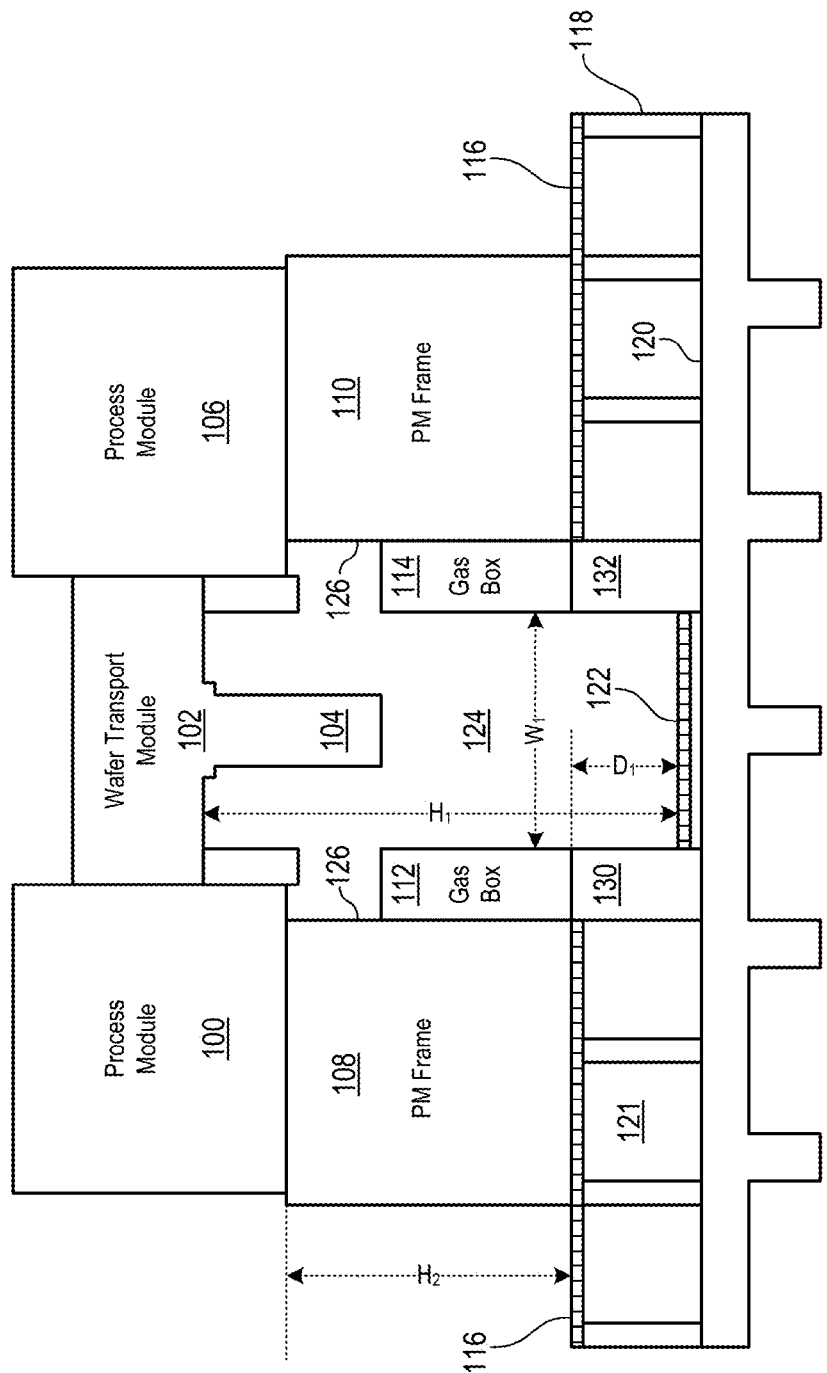
FIG. 1A conceptually illustrates a cross-section of a portion of a cluster tool for processing wafers, in accordance with implementations of the disclosure.

FIG. 1A conceptually illustrates a cross-section of a portion of a cluster tool for processing wafers, in accordance with implementations of the disclosure. In the illustrated implementation, a fabrication facility floor 116 is shown, upon which equipment may be positioned. The fabrication facility floor 116 is defined as an elevated floor that is supported over an underlying subfloor 120. The fabrication facility floor 116 can be defined by a series of tiles, which may be perforated to permit airflow through the tiles to remove particulates from the fab environment. The tiles are supported by stanchions 118 above the subfloor 120. In some implementations, the distance between the fabrication facility floor and the subfloor 120 is approximately 2 feet (approximately 60 centimeters). In some implementations, the distance between the fabrication facility floor and the subfloor 120 is in the range of approximately 1.5 to 2.5 feet (approximately 45 to 75 centimeters). In some implementations, the distance between the fabrication facility floor 116 and the subfloor 120 is in the range of approximately 1 to 4 feet (approximately 0.3 to 1.2 meters).

In some implementations, the subfloor 120 is defined by a concrete waffle slab. The subfloor space 121 that is defined between the fabrication facility floor 116 and the subfloor 120 can be utilized for passage of various facilities lines, such as process gas lines, vacuum lines, electrical/RF lines/feeds, data cables, liquid supply lines, etc. It will be appreciated that passage of such lines can be along the subfloor 120 and may also extend through the subfloor 120 to the floor below, permitting connection to supporting equipment located on the floor below.

Process modules 100 and 106 are positioned at an elevated height above the fabrication facility floor 116. More specifically, in the illustrated implementation, the process modules 100 and 106 are supported by process module frames 108 and 110, respectively. Each process module frame is configured to elevate its respective process module and thereby provide an underlying space below the process module to accommodate various facilities and equipment which are required for operation of the process module. By situating facilities below the process module, the horizontal space required for operation is conserved, which permits process modules to be placed closer to each other within a given cluster tool system, and thereby also permits adjacent cluster tool systems to be placed closer to each other.

In some implementations, the space below the process module that is defined by the process module frame is configured to have a minimum height so as to accommodate an RF feed having a predefined vertical length that extends downward from the process module. The RF feed structure may be connected to a chuck that is configured to be moved up and down within the chamber of the process module, thereby also moving the RF feed structure up and down, and so the process module frame is configured to provide ample height to accommodate such vertical movements.

As process modules and cluster tool systems are more tightly packed together, access space becomes more limited relative to the number of equipment pieces and cluster tool systems in a given area of the fabrication facility. This can be problematic as limited access to equipment makes service or repair operations more difficult to perform, and may require additional steps to gain the necessary access to the equipment, such as disassembling or moving portions of or entire pieces of equipment. Such additional steps will increase downtime and therefore reduce some of the yield benefit that would otherwise be achieved through a compact footprint architecture.

To address these issues, in accordance with implementations of the disclosure, a service tunnel 124 is provided in a space below the wafer transport modules (including wafer transport module 102) of the cluster tool. The service tunnel 124 is further defined by a service floor 122 below the wafer transport module 102. The service floor 122 is a dropped floor relative to the fabrication facility floor 116, and is defined at a height below that of the fabrication facility floor but above the subfloor 120. The service floor 122 thus leverages the subfloor space that would otherwise exist between the fabrication facility floor 116 and the subfloor 120, and utilizes this space to provide additional height for the service tunnel 124. The service tunnel 124 is thus defined between the wafer transport module 102 and the service floor 122, and has a height $H_1$ that is sufficient for an average size human (approximately 5 to 6 feet (approximately 150 to 180 cm) tall) to stand up. In some implementations, the height $H_1$ is in the range of approximately 2 to 8 feet (approximately 0.6 to 2.4 meters). In some implementations, the height $H_1$ is in the range of approximately 5.5 to 7.5 feet (approximately 1.7 to 2.3 meters). In some implementations, the height $H_1$ is approximately 7 feet (approximately 2.1 meters).

It should be appreciated that the service tunnel 124 and cluster tool architecture as defined in accordance with implementations of the present disclosure are compliant with SEMI (Semiconductor Equipment and Materials International) E72 standards governing space requirements for semiconductor manufacturing equipment.

In the illustrated implementation, a robot actuator 104 which is part of the wafer transport module 102 is shown for completeness of the disclosure. The robot actuator 104 as shown is contemplated as being an approximately cylindrical structure extending downward from the main body of the wafer transport module 102. Adjacent to the robot actuator 104 (fore, aft, and lateral to the robot actuator), the height of the service tunnel space extends from the service floor 122 to the bottom of the wafer transport module 102 providing the height $H_1$ which is sufficient for an average size human to stand without impediment.

The service tunnel 124 is defined between the process modules 100 and 106, and also between the process module frames 108 and 110. In some implementations, gas boxes 112 and 114, which service process modules 100 and 106, respectively, are positioned along the sides of the service tunnel 124. The service tunnel 124 may therefore have a width $W_1$. In accordance with some implementations, the width $W_1$ is in the range of approximately 2 to 6 feet (approximately 0.6 to 1.8 meters). In some implementations, the width $W_1$ is in the range of approximately 2.5 to 4 feet (approximately 0.7 to 1.3 meters). In some implementations, the width $W_1$ is in the range of approximately 3 to 3.5 feet (approximately 0.9 to 1.1 meters). The interior facing portions of the process module frames define sidewalls for the service tunnel.

The service tunnel 124 provides access to the equipment of the cluster tool system from the interior region of the cluster tool system. This access is important as the process modules and other equipment of the cluster tool system are positioned very close to each other to reduce the footprint of the system. More specifically, the service tunnel 124 provides access to the underside of the wafer transport module 102, and to interior-facing sides of the process modules 100 and 106. The gas boxes 112 and 114 provide access to gas lines which service the process modules 100 and 106, respectively. Gas boxes 112 and 114 are defined along the sidewalls of the service tunnel and are also accessible from the service tunnel 124.

The interior height $H_1$ of the service tunnel is defined by the vertical dimensions of various components of the system, including the depth $D_1$ of the service floor 122 below the level of the fabrication facility floor 116, as well as the height $H_2$ at which the process module frames 108 and 110 are configured to raise the process modules 100 and 106. The available depth for the service floor is dependent upon the elevation of the fab floor above the subfloor, i.e. the height $H_1$. Thus, in various implementations, the depth $D_1$ of the service floor may range from 0 to the value of $H_1$. In some implementations, the depth $D_1$ ranges from approximately 0 to 4 feet (approximately 0 to 60 cm). In some implementations, the depth $D_1$ ranges from approximately 1 to 2 feet (approximately 30 to 60 cm). In some implementations, the depth $D_1$ ranges from approximately 1.5 to 1.8 feet (approximately 45 to 55 cm).

In some implementations, the height $H_2$ of the process module frames is in the range of approximately 2 to 6 feet (approximately 0.6 to 1.8 meters). In some implementations, the height $H_2$ is in the range of approximately 3 to 6 feet (approximately 0.9 to 1.8 meters). In some implementations the height $H_2$ is in the range of approximately 2.5 to 4.5 feet (approximately 0.8 to 1.4 meters). The service tunnel 124 in some implementations is defined beneath a wafer transport assembly that is defined by one or more wafer transport modules, such as wafer transport module 102. In some implementations, the service tunnel extends lengthwise from a front end defined at an equipment front end module (EFEM) to a back end defined by a back side of a rear-most wafer transport module. The service floor 122 of the service tunnel 124 can be conceptually understood as defining a pit located below the wafer transport assembly, to provide for an adequate vertical height to allow personnel to stand unimpeded in the pit.

Entry into the service tunnel 124 is provided from the rear end of the service tunnel which opens to the fabrication facility floor. To provide for ingress and egress from the service tunnel 124, a ladder or a set of steps/stairs can be positioned at the rear end of the service tunnel 124, which define a pathway from the service floor 122 up to the fabrication facility floor 116. In some implementations, a foldable step ladder can be provided that defines the steps when unfolded, but can also be folded up when not in use. In this manner, the steps for entry/exit are provided when needed, but can be stowed when not needed and therefore do not occupy service floor space for purposes of meeting standardized service floor space requirements. In some implementations, when folded up, the step ladder may be configured to block the entry into the service tunnel, enhancing the safety of the system and preventing persons from accidentally falling into the service tunnel.

Figure 1B:
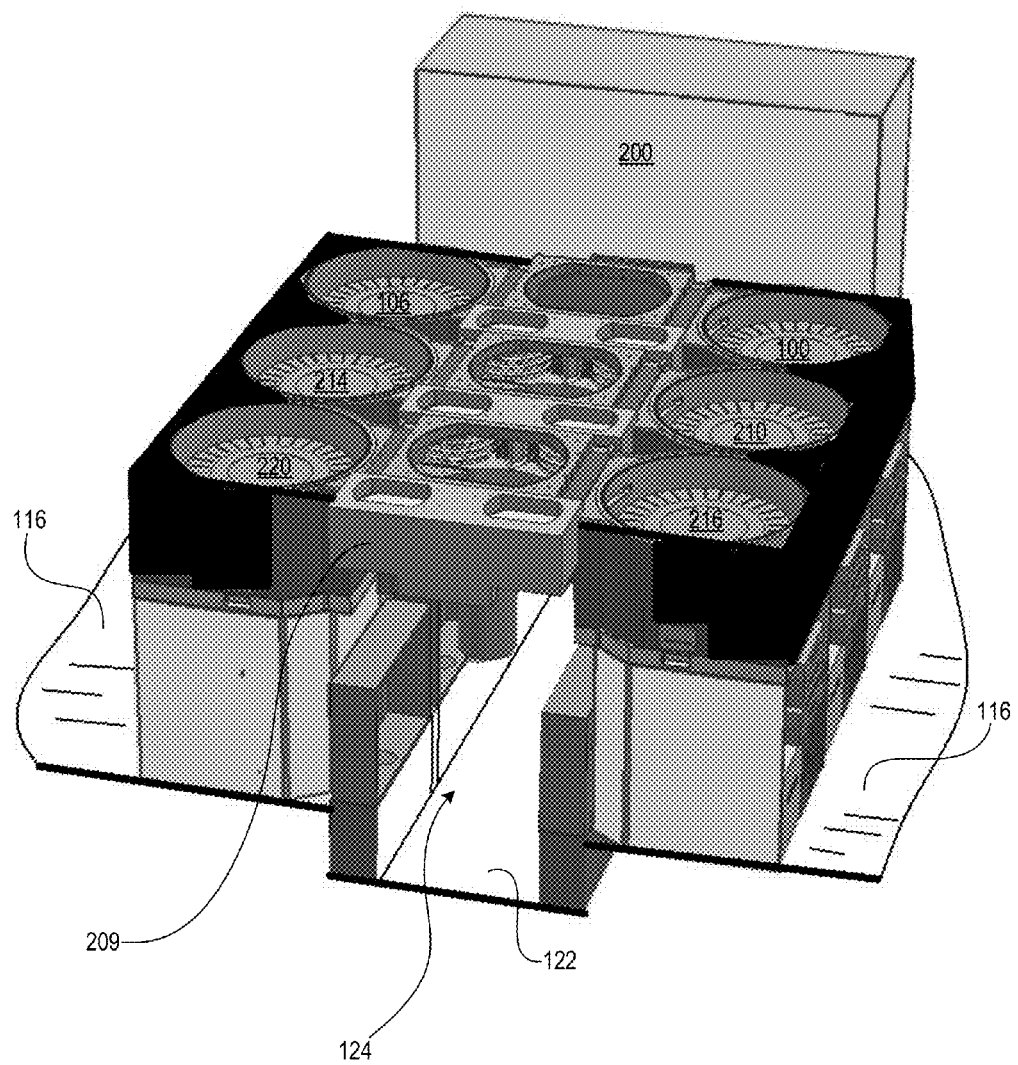
FIG. 1B illustrates a perspective view of a cluster tool system, in accordance with implementations of the disclosure.

FIG. 1B illustrates a perspective view of a cluster tool system, in accordance with implementations of the disclosure. In the illustrated implementation, the rear end opening of the service tunnel 124 is visible. As shown, the service tunnel 124 is defined underneath the wafer transport assembly 209, extending from a front end of the wafer transport assembly 209 that is oriented towards the EFEM 200, to a rear end of the wafer transport assembly 209 opposite the front end.

Figure 1C:
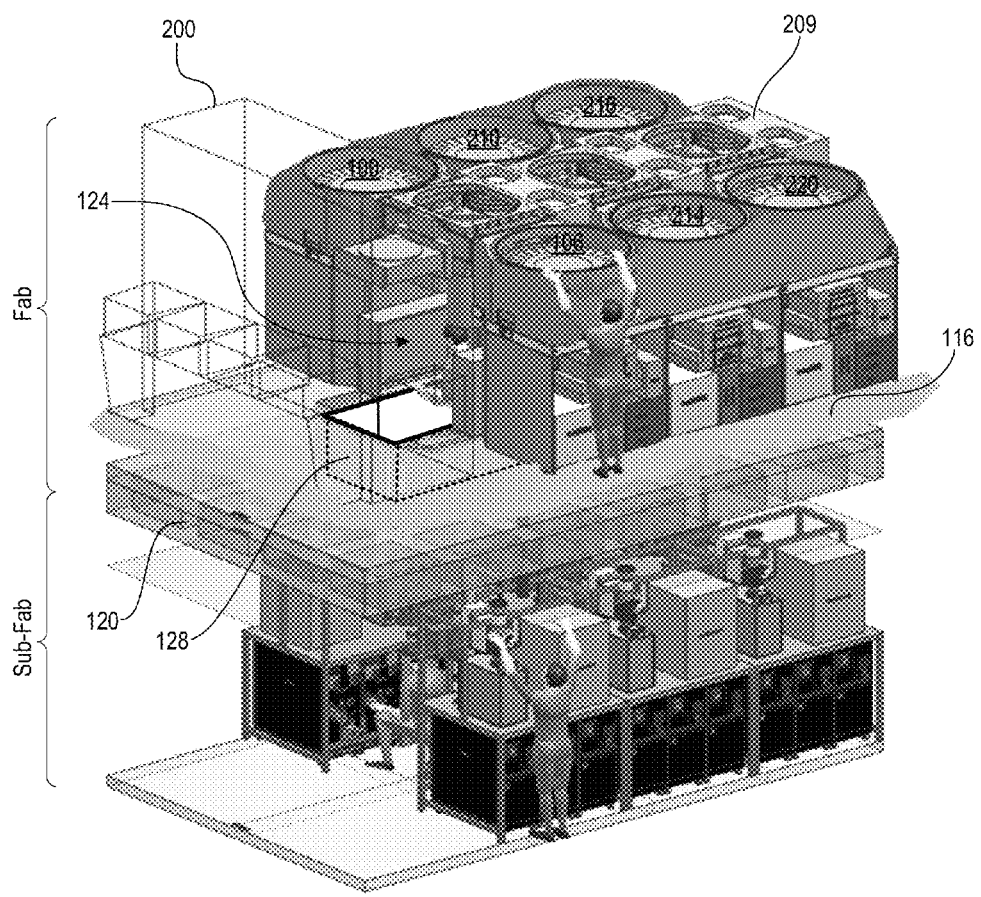
FIG. 1C illustrates a perspective view of a cluster tool system, in accordance with implementations of the disclosure.

FIG. 1C illustrates a perspective view of a cluster tool system, in accordance with implementations of the disclosure. In the illustrated implementation, a fab level and a sub-fab level are shown, with supporting equipment for operation of the process modules being positioned at the sub-fab level. The front end 128 of the service tunnel 124 is visible in the illustrated implementation. As shown in accordance with implementations of the disclosure, the front end 128 of the service tunnel 124 may extend to the EFEM 200.

Figure 1D:
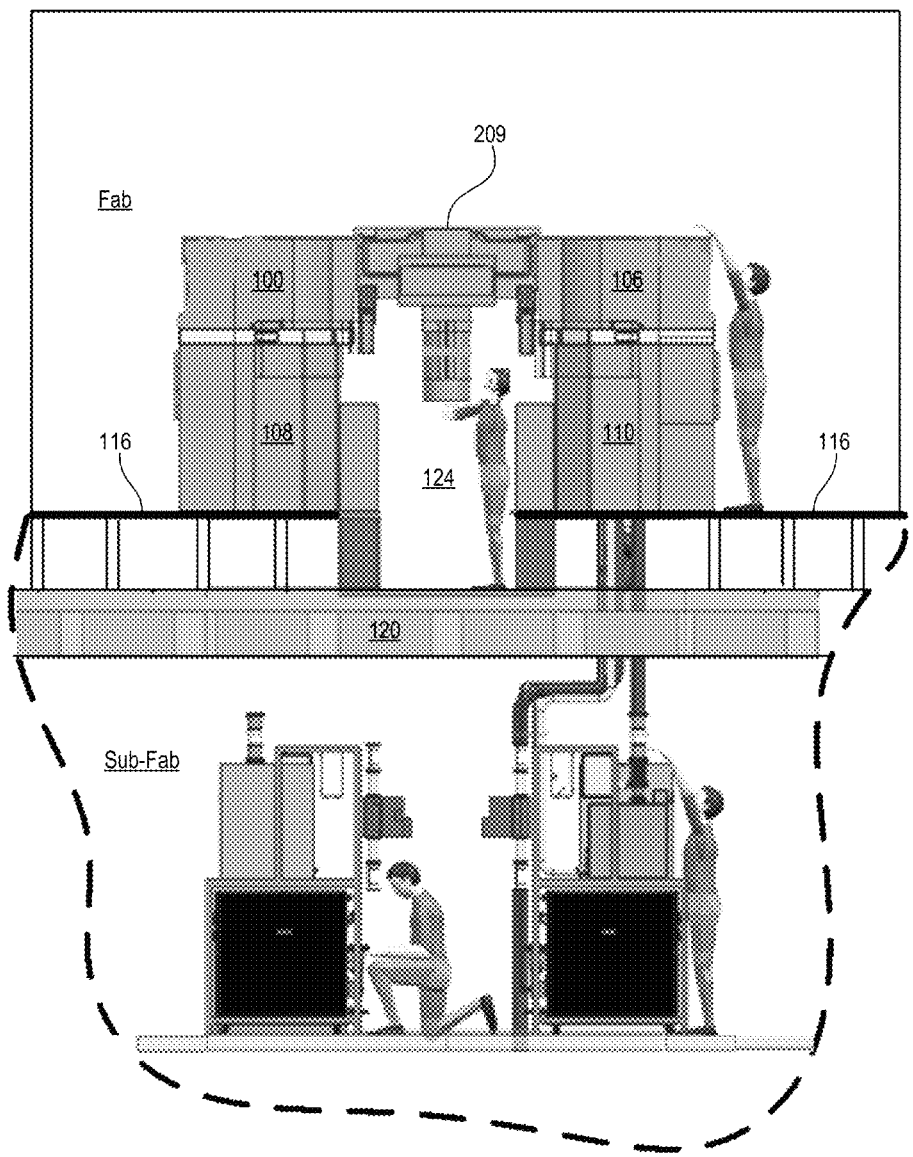
FIG. 1D illustrates a cross-section view of a cluster tool system, in accordance with implementations of the disclosure.

FIG. 1D illustrates a cross-section view of a cluster tool system, in accordance with implementations of the disclosure. The illustrated implementation again shows the relationship between the fab level and the sub-fab level. The illustrated persons are shown approximately to scale, providing an indication of the available space in the service tunnel 124 for persons to maneuver.

Figure 1E:
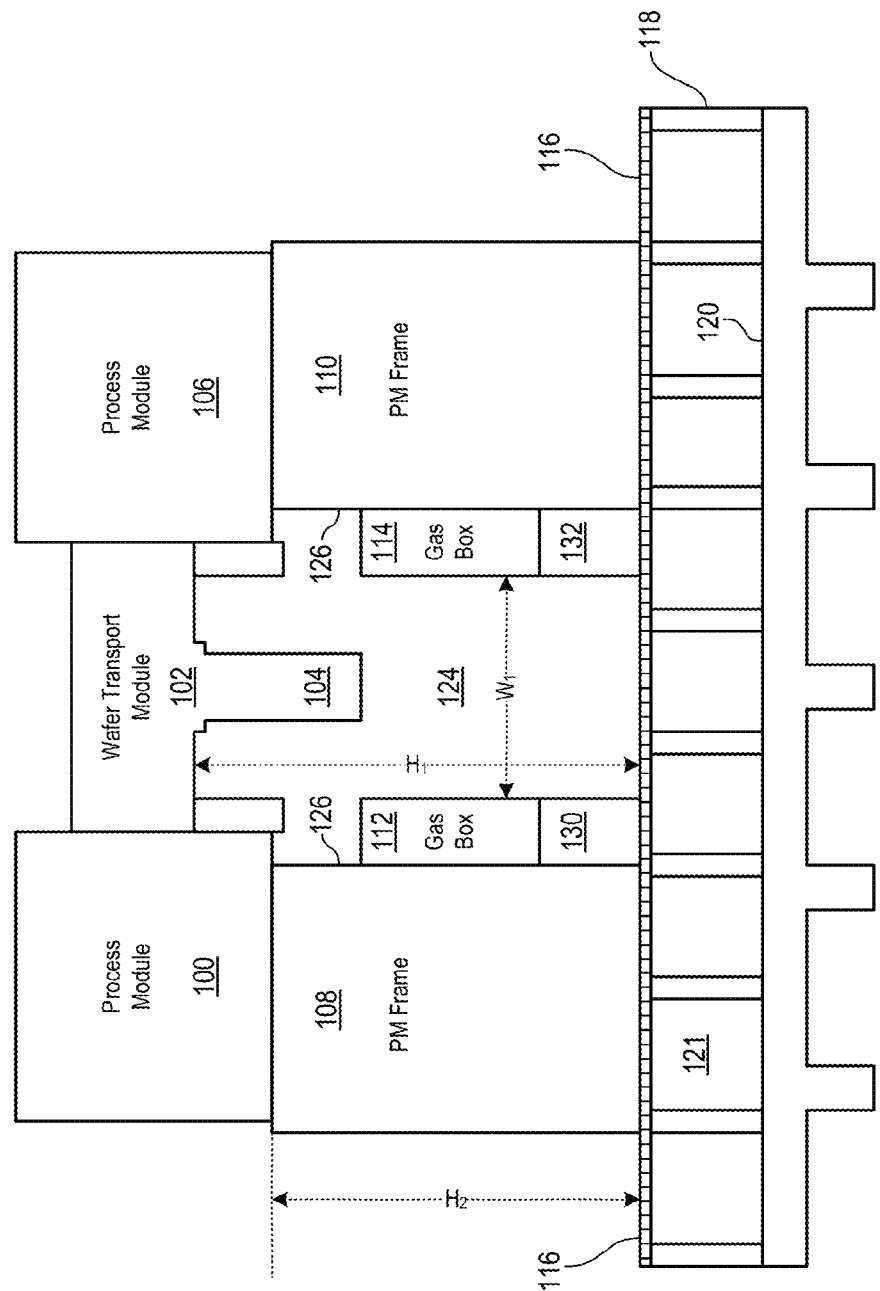
FIG. 1E conceptually illustrates a cross-section of a portion of a cluster tool for processing wafers, in accordance with implementations of the disclosure.

FIG. 1E conceptually illustrates a cross-section of a portion of a cluster tool for processing wafers, in accordance with implementations of the disclosure. In the implementation of FIG. 1E, the floor of the service tunnel 124 is defined at the level of the fab floor 116. In some implementations, the floor of the service tunnel 124 can be defined by the fab floor 116. Whereas in other implementations, the floor of the service tunnel 124, while being defined at the level of the fab floor 116, may have a different structure than that of the surrounding fab floor 116. It will be appreciated that the height $H_2$ of the process module frames 108 and 110 will be higher as compared to the implementation of FIG. 1A. In implementations as shown with continued reference to FIG. 1E, wherein the floor of the service tunnel 124 is defined at the level of the fab floor 116, the height $H_2$ of the process module frames typically ranges from about 2 to 6 feet (approximately 0.6 to 1.8 meters). In some implementations, the height $H_2$ ranges from about 4.5 to 6.5 feet (approximately 1.4 to 2 meters). In some implementations, the height $H_2$ ranges from about 4 to 7 feet (approximately 1.2 to 2.1 meters).

FIG. 1F illustrates a cut-away view (vertical cut-away along a longitudinal front-to-rear axis) of a cluster tool for processing wafers, in accordance with implementations of the disclosure. The interior of the service tunnel 124 is thus shown in the illustrated figure. The gas boxes 114, 134, and 136 provide access to gas lines which feed to the process modules 106, 214, and 220, respectively. The gas boxes are positioned over a scrubbed exhaust duct 132 which exhausts air from the fab. In the illustrated implementation, a side cover of the exhaust duct 132 is removed. The gas boxes include perforations 137 to allow air from the fab to flow through them and into the exhaust duct 132. The dashed arrows in the diagram illustrate the direction of airflow through the gas boxes and into the exhaust duct, for eventual routing and removal through the subfloor of the fab.

Additionally, in some implementations, gas lines 138 are positioned inside of the exhaust duct 132. By running the gas lines through the exhaust duct, space is conserved in the fab, allowing the exhaust duct to serve an additional function. Furthermore, by positioning the gas lines in the exhaust duct, the potential for contamination in the fab due to gas line leaks is minimized, as any leaked gaseous species are immediately exhausted via the exhaust duct. Because the risk of contamination is minimized, then it may be possible to use lower grade gas line material (than would otherwise be utilized for gas lines positioned outside of the exhaust duct), thereby reducing cost.

Figure 2:
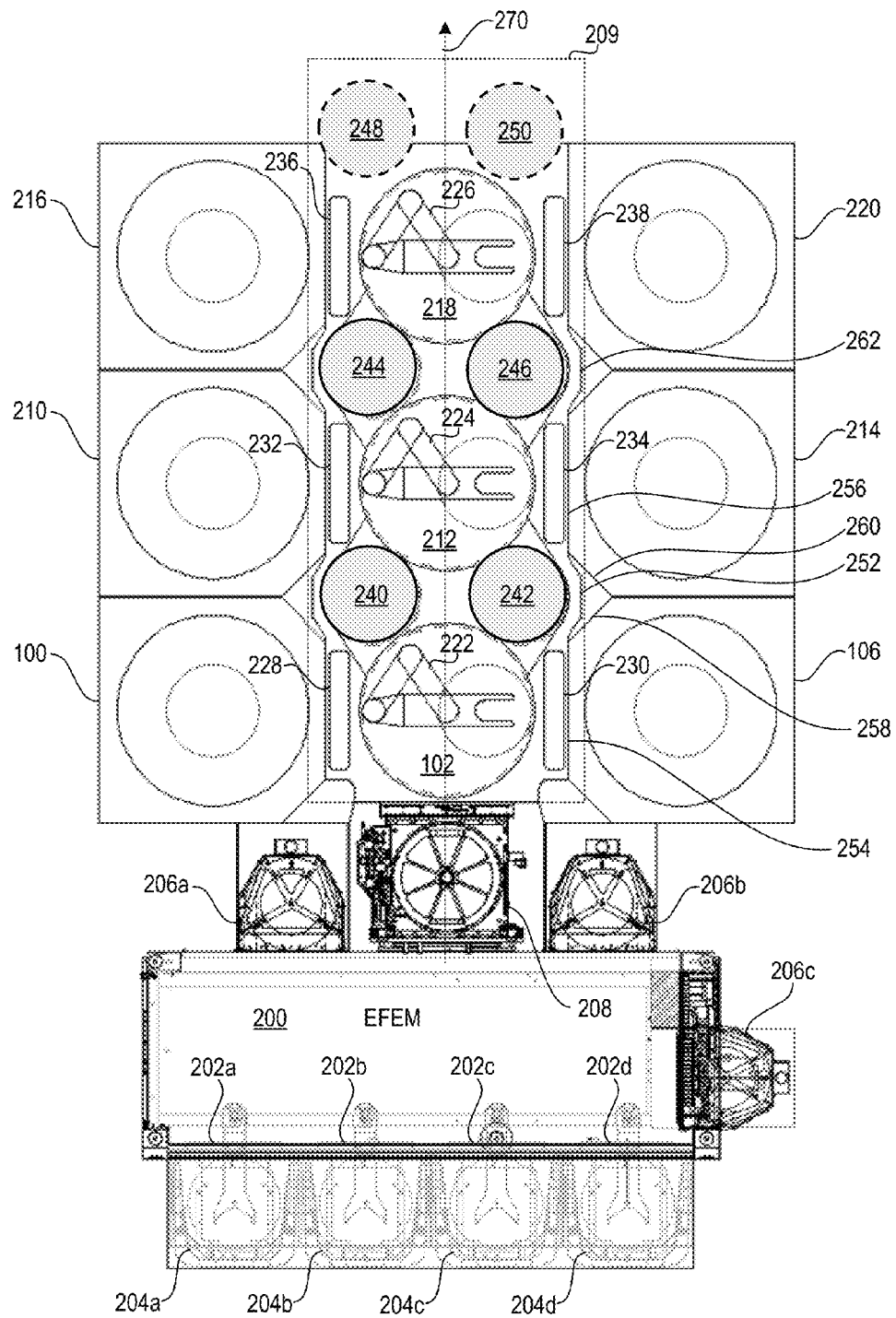
FIG. 2 illustrates an overhead view of a cluster tool system, illustrating conceptual cutaways of various equipment pieces of the system, in accordance with implementations of the disclosure.

FIG. 2 illustrates an overhead view of a cluster tool system, illustrating conceptual cutaways of various equipment pieces of the system, in accordance with implementations of the disclosure. The front of the cluster tool system is defined by an equipment front end module (EFEM) 200 which includes a plurality of load ports 202a, 202b, 202c, and 202d for receiving a plurality of wafer transport containers 204a, 204b, 204c, and 204d, respectively. In some implementations, the wafer transport containers are front opening unified pods (FOUP's). The EFEM 200 may further include buffer stations 206a, 206b, and 206c. The EFEM 200 and its buffer stations 206a, 206b, and 206c, can be operated under controlled ambient conditions or under atmospheric conditions.

Connected to the rear of the EFEM 200 is a load lock 208 that defines a passageway into a wafer transport assembly 209. The wafer transport assembly is defined by a plurality of wafer transport modules 102, 212, and 218, which are connected in series, and extend back from the load lock 208. Each of the wafer transport modules controls entry into, and exit from, adjoining process modules. For example, the wafer transport module 102 is configured to move wafers into or out of adjoining process modules 100 and 106. Wafer transport module 212 is configured to move wafers into or out of adjoining process modules 210 and 214. Wafer transport module 218 is configured to move wafers into or out of the adjoining process modules 216 and 220.

Each of the wafer transport modules includes a robot (robotic wafer handler) configured to engage and pick up wafers and transport them. In the illustrated implementation, wafer transport modules 102, 212, and 218, include robots 222, 224, and 226, respectively. The robots may have end effectors which are configured for engaging with wafers. Thus the robots of the wafer transport modules are configured to move the wafers within the wafer transport assembly 209, and further to move the wafers into or out of adjoining process modules.

In the illustrated implementation, the wafer transport assembly 209 is defined by the wafer transport modules 102, 212, and 218. The wafer transport assembly 209 extends from the load lock 208 rearward to the back side of the rear-most wafer transport module 218. As noted previously, the service tunnel 124 is defined underneath the wafer transport assembly 209. In some implementations, the service tunnel 124 extends from the front end of the wafer transport assembly 209 (defined by the front end of the wafer transport module 102) to the back end of the wafer transport assembly 209 (defined by the back end of the wafer transport module 218). In some implementations, the service tunnel 124 extends at its front end to the EFEM 200. The service tunnel 124 provides access to the undersides of the wafer transport modules 102, 212, and 218, to for example, service the robots 222, 224, and 226 of the wafer transport modules.

The wafer transport assembly 209 further includes gate valves which control an opening between a given wafer transport module and an adjacent process module. In the illustrated implementation, the gate valve 228 controls an opening between the wafer transport module 102 and the process module 100; the gate valve 230 controls an opening between the wafer transport module 102 and the process module 106; the gate valve 232 controls an opening between the wafer transport module 212 and the process module 210; the gate valve 234 controls an opening between the wafer transport module 212 and the process module 214; the gate valve 236 controls an opening between the wafer transport module 218 and the process module 216; the gate valve 238 controls an opening between the wafer transport module 218 and the process module 220.

A given gate valve can be opened to allow a wafer to be transported into or out of an adjacent process module by the corresponding wafer transport module. The gate valve may be closed to isolate the adjacent process module, for example, for processing of a wafer that has been placed into the process module or for performance of any other operation requiring isolation of the process module from the wafer transport module. In some implementations, the gate valves 228, 230, 232, 234, 236, and 238 are integrated into the wafer transport assembly 209. By integrating the gate valves into the wafer transport assembly 209, the overall footprint of the wafer transport assembly is reduced (as compared to a wafer transport assembly having non-integrated gate valves). The interior environment of the wafer transport assembly 209 is controlled, and can be defined as a vacuum environment or a controlled ambient environment. In some implementations, the wafer transport assembly 209 is filled with an inert gas. In various implementations, the wafer transport assembly 209 is operated under pressure conditions ranging from atmosphere to vacuum conditions. In accordance with some implementations of the disclosure, vacuum conditions can be defined by an internal pressure that is less than about 760 Torr. In accordance with some implementations of the disclosure, vacuum conditions can be defined by an internal pressure that is less than about 10 Torr. In some implementations, a vacuum condition is defined by an internal pressure ranging from about $1 \times 10^{-9}$ Torr to about 1 Torr.

With continued reference to FIG. 2, in accordance with implementations of the disclosure, a plurality of buffer stacks are defined in the wafer transport assembly 209. Buffer stacks 240 and 242 are defined between the wafer transport modules 102 and 212. Buffer stacks 244 and 246 are defined between the wafer transport modules 212 and 218. Buffer stacks 248 and 250 are defined at the back side of the wafer transport module 218. It should be appreciated that the buffer stacks are defined within the wafer transport assembly 209, and as such, the buffer stacks share the same controlled environment as that of the wafer transport assembly. This provides an advantage over conventional systems in that wafers do not need to exit the controlled environment of the wafer transport assembly 209 to be stored. As wafers can be buffered in the wafer transport assembly 209, they are thus immediately accessible by wafer transport modules to be transported to a process module or elsewhere.

In some implementations, a given buffer stack is configured to have a capacity to store approximately 2 to 20 wafers. In some implementations, a given buffer stack is configured to have a capacity to store approximately 5 to 15 wafers. In some implementations, a given buffer stack may have a capacity to store approximately 5 to 10 wafers. In some implementations, a given buffer stack may have a capacity to store approximately 8 wafers. Each buffer stack defines a plurality of storage slots that are defined in a vertically stacked arrangement. The storage slots can have separators or partitions defined between them, which isolate a given wafer in the wafer stack from other wafers.

As noted, the buffer stacks are positioned between adjacent wafer transport modules. Additionally, the buffer stacks are positioned along the lateral sides of the wafer transport assembly, which achieves a compact footprint of the wafer transport assembly, as the buffer stacks are positioned to leverage the space that exists between adjacent wafer transport modules and adjacent process modules which are connected to the wafer transport modules. More specifically, the central axes of the buffer stacks are laterally offset from a medial plane defined by the central rotational axes of the robots of the wafer transport modules. The central axis of a given buffer stack is defined as a vertical axis extending through the centers of wafers when they are stored in the buffer stack. And the central rotational axes of the robots are aligned with each other in a front-to-rear arrangement that defines the medial plane. A single directional axis 270 can be defined along this medial plane, extending rearward from the EFEM 200. As discussed further below, buffer modules which define the buffer stacks can be provided. The wafer transport modules and buffer modules are aligned in the single directional axis 270.

With continued reference to FIG. 2, the buffer stack 242 is defined in a location nested between the wafer transport modules 102 and 212, and the process modules 106 and 214. The lateral side protrusion 252 of the wafer transport assembly 209, which accommodates and defines the location of the buffer stack 242, extends laterally beyond the lateral side portions 252 and 254 that interface with the adjacent process modules 214 and 106, respectively. Additional lateral side protrusions of the wafer transport assembly accommodating and define locations of the additional buffer stacks and are similarly configured relative to their corresponding process modules. For example, the lateral side protrusion 262 is nested between the wafer transport modules 212 and 218, and the process modules 214 and 220. The lateral side protrusion 262 is configured to define the location of the buffer stack 246.

In some implementations, the wafer transport assembly is configured so that the outer edges of wafers, when positioned on a buffer stack, extend laterally at least to a plane defined by the opening of an adjacent gate valve. In some implementations, the outer edges of wafers, when positioned on the buffer stack, extend laterally beyond such a plane. The further the buffer stacks are laterally positioned, the closer the adjacent wafer transport modules can be positioned to each other; however, the wider the wafer transport assembly 209 will become.

In terms of the architectural concept of the wafer transport assembly, the locations of the buffer stacks are positioned laterally outward, which allows the wafer transport modules to be more closely placed to each other. This reduces the overall length of the wafer transport assembly from front to rear. In some implementations, the front-to-rear length of the wafer transport assembly is approximately 10 to 11 feet (approximately 3 to 3.3 meters) for a wafer transport assembly having three wafer transport modules and four buffer stacks (without the optional buffer stacks 248 and 250). In some implementations, the front-to-rear length of the wafer transport assembly is approximately 6 to 8 feet (approximately 1.8 2.4 meters) for a wafer transport assembly having two wafer transport modules and two or four buffer stacks.

In view of the placement of the buffer stacks and more specifically, the protrusion of the lateral side portions of the wafer transport assembly that accommodate the buffer stacks, the corner regions of the process modules that are nearest to the buffer stacks are cut off or rounded off. By way of example with continued reference to FIG. 2, the corner region 258 of process module 106 is cut off to accommodate the protrusion of the lateral side portion 252 of the wafer transport assembly. Similarly, the corner region 260 of process module 214 is also cut off to accommodate the protrusion of the lateral side portion 252. The additional process module corner regions nearest to the buffer stacks are similarly configured to accommodate the lateral protrusion of the lateral side portions of the wafer transport assembly which are defined to accommodate the buffer stacks.

It should be appreciated that the cut off corner regions of the process modules allow the process modules to be positioned closer to their respective wafer transport modules than would otherwise be possible given the placement of the buffer stacks in the wafer transport assembly 209. This reduces the lateral space requirement of the cluster tool system, thus providing for more efficient space utilization in the fabrication facility. Overall, the placement of the buffer stacks, the configuration of the lateral sides of the wafer transport assembly, and the cut off configuration of the corner regions of the process modules, together provide a very compact cluster tool architecture that also affords great flexibility in terms of wafer handling, storage, and transport within a controlled environment.

Figure 3A:
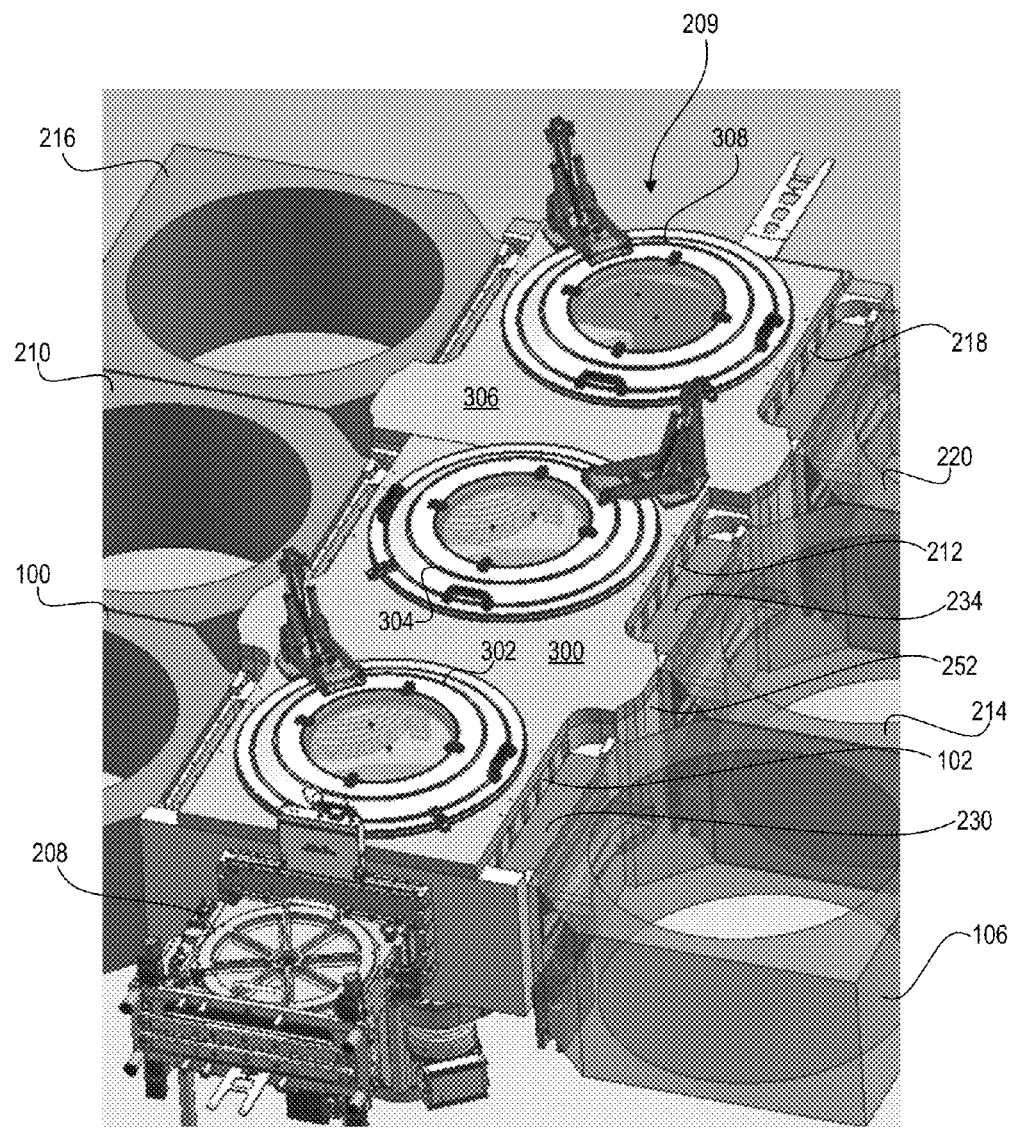
FIG. 3A is a perspective view of a wafer transport assembly, in accordance with implementations of the disclosure.

FIG. 3A is a perspective view of a wafer transport assembly, in accordance with implementations of the disclosure. In the illustrated implementation, the wafer transport assembly 209 is composed of two sections, which are assembled to each other to define the wafer transport assembly 209 as shown. A first section of the wafer transport assembly 209 is defined to include the wafer transport modules 102 and 212, as well as the buffer stacks 240 and 242 which are defined between the wafer transport modules 102 and 212. The first section can be modularly assembled from the wafer transport modules 102 and 212 in conjunction with a buffer module (positioned between the wafer transport modules) that defines the buffer stacks 240 and 242. It will be appreciated that the wafer transport modules and the buffer module are aligned in the single directional axis 270. A second section of the wafer transport assembly 209 is defined to include the wafer transport module 218 as well as the buffer stacks 244 and 246, which are defined between the wafer transport modules 212 and 218. A second buffer module can be configured to define the buffer stacks 244 and 246, with the wafer transport modules 218 and the second buffer module being aligned in the single directional axis 270. Though not shown in FIG. 3A, an optional third section can be attached to the rear end of the second section, the third section being a (third) buffer module that defines the buffer stacks 248 and 250, and which is also aligned in the single directional axis 270.

The modular configuration thus shown and described allows for the wafer transport assembly to be configured to have two or three wafer transport modules, and have one, two, or three pairs of buffer stacks. In a base configuration, the wafer transport assembly can be defined to include only the first section, and therefore will have two wafer transport modules and two buffer stacks. In some implementations, the base configuration is designed to fit within a SEMI E72 compliant elevator, thereby facilitating move-in to a fabrication facility. In another configuration, a buffer module can be added to the base configuration to add two additional buffer stacks (total of four buffer stacks). In another configuration, the aforementioned second section can be joined to the first section to define a wafer transport assembly as shown in FIG. 3A, having three wafer transport modules and four buffer stacks. In yet another configuration, a buffer module can then be added to provide for a wafer transport assembly having three wafer transport modules and six buffer stacks.

In the illustrated implementation, a first cover plate 300 defines the top of the first section of the wafer transport assembly 209. The first cover plate 300 includes window portals 302 and 304 which allow for visual inspection of the interior of the wafer transport assembly, and which may be opened to provide access to the interior. A second cover plate 306 defines the top of the second section of the wafer transport assembly 209. The second cover plate 306 also includes a window portal 308, which similarly allows for visual inspection of the interior and may be opened to provide access thereto.

The wafer transport assembly 209 has thus been described as composed of several modular components. The modular assembly of the wafer transport assembly provides for ease of configuration to suit particular cluster tool setups, and also facilitates repair and/or replacement of individual modules. Also, the assembly/disassembly of the modules facilitates move-in or move-out from a given fabrication facility location. It will be appreciated that when fully assembled, the various modules of the wafer transport assembly 209 together define an outer housing, the housing defining an interior region that is continuous and maintained as a controlled environment. The housing contains the various componentry of the wafer transport assembly 209, including the robots and the buffer stacks.

Positioned at the front end of the wafer transport assembly 209 is a load lock module 208. The load lock module 208 controls entry into and out of the wafer transport assembly 209, facilitating transfers of wafers between the lab ambient condition of the EFEM and the vacuum or controlled ambient condition of the wafer transport assembly 209. In some implementations, the load lock module 208 is a double unit—that is, load lock module 208 includes two separate load lock slots that are independently controlled to allow two individual wafers to be simultaneously loaded and/or unloaded from the wafer transport assembly 209. The time required to evacuate a load lock slot (e.g. when a wafer is moving from the ambient condition of the EFEM into the vacuum condition of the wafer transport assembly) and/or fill a load lock slot (e.g. when a wafer is moving from the vacuum condition of the wafer transport assembly to the ambient condition of the EFEM) is time consuming and can become a limiting factor in the ability of the cluster tool system to process wafers. Therefore, it is desirable to provide for more than one load lock slot to allow multiple wafers to enter and/or exit the wafer transport assembly 209 simultaneously.

Figure 3B:
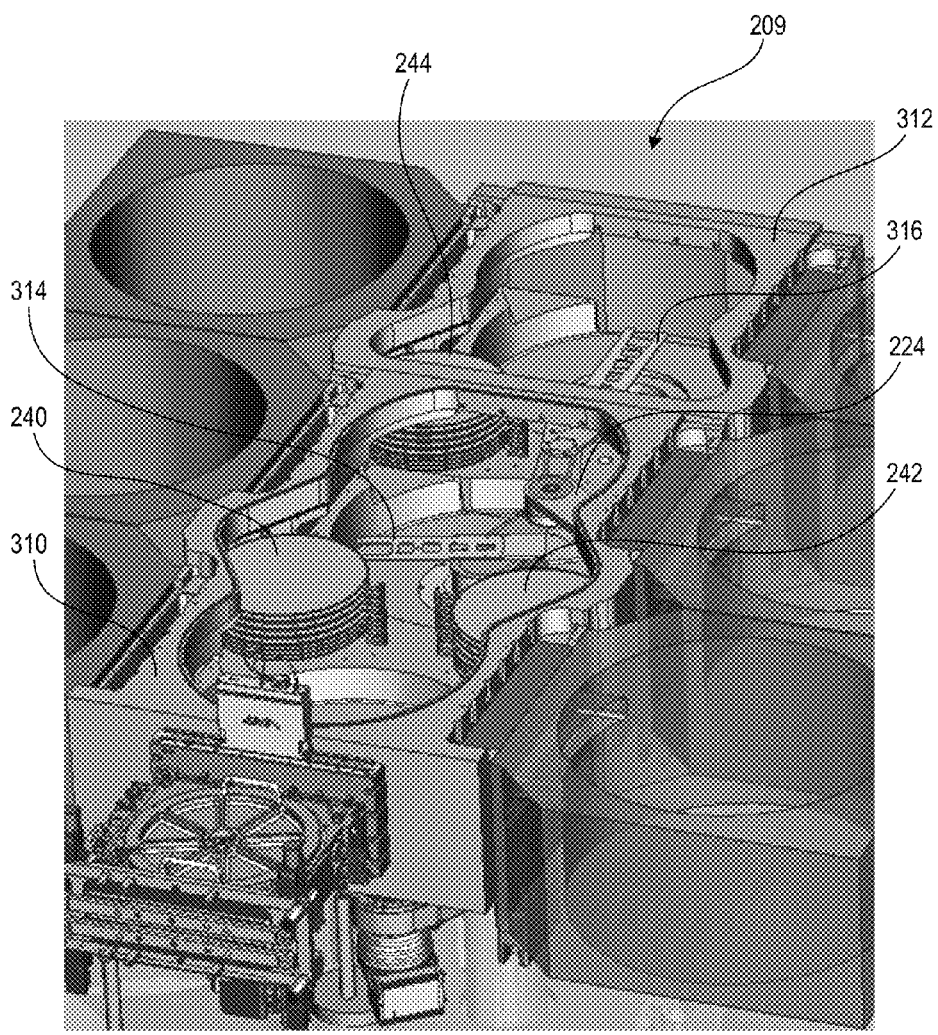
FIG. 3B illustrates a perspective view of the wafer transport assembly of FIG. 3A, without the cover plates installed, so as to provide a view of the interior of the wafer transport assembly, in accordance with implementations of the disclosure.

FIG. 3B illustrates a perspective view of the wafer transport assembly of FIG. 3A, without the cover plates installed, so as to provide a view of the interior of the wafer transport assembly, in accordance with implementations of the disclosure. As can be seen, the first section 310 of the wafer transport assembly 209 includes the buffer stacks 240 and 242, as well as robot 224 (robot 102 is not visible in FIG. 3B). The robot 224 includes an end effector 314 that is configured to engage and support a wafer for handling by the robot. The second section 312 of the wafer transport assembly is shown including the buffer stack 244 (buffer stack 246 not visible in FIG. 3B) and an end effector 316 of the robot 226.

Figure 4A:
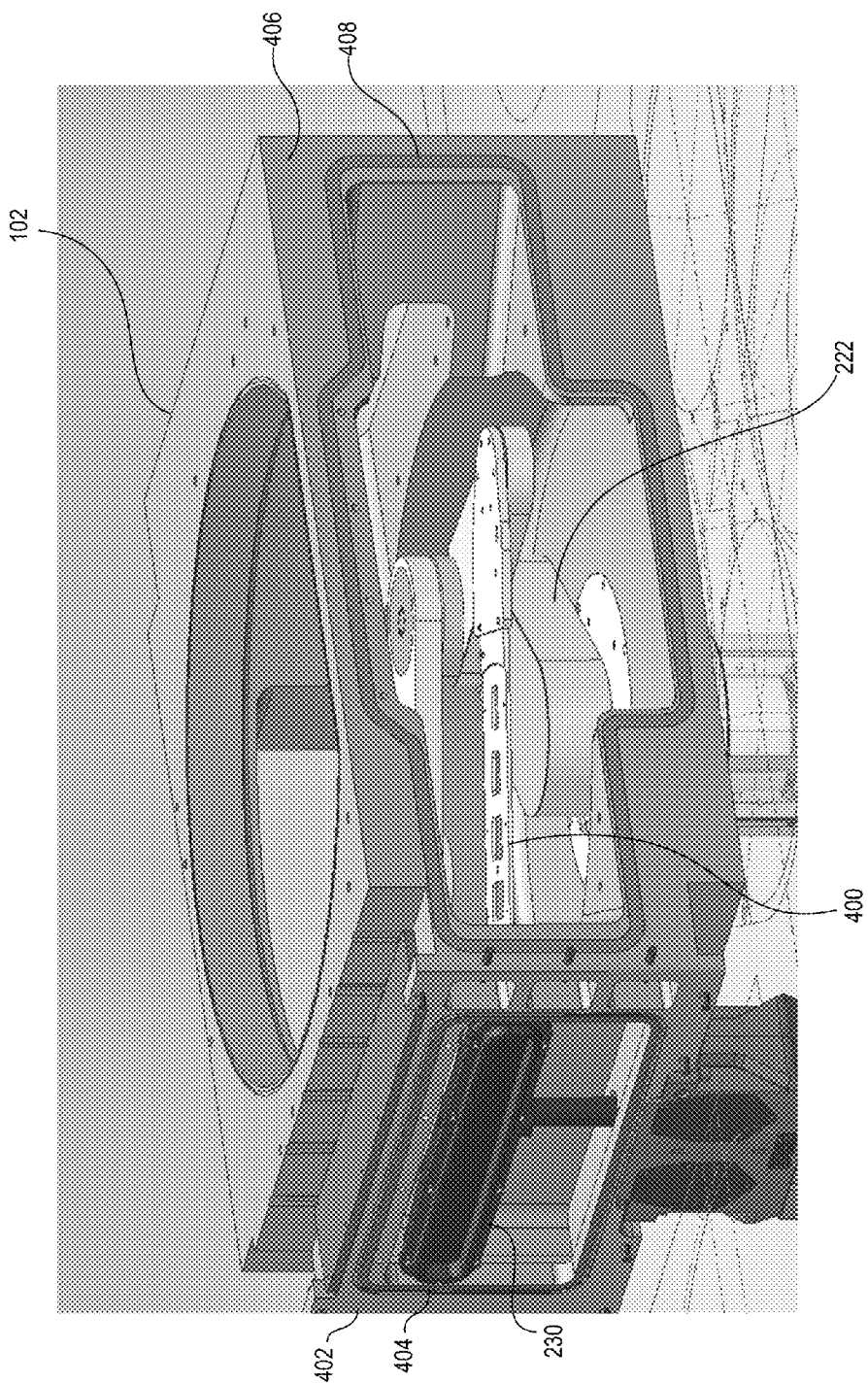
FIG. 4A illustrates a perspective view of a wafer transport module, in accordance with implementations of the disclosure.

FIG. 4A illustrates a perspective view of a wafer transport module, in accordance with implementations of the disclosure. For ease of description and contextual understanding of the wafer transport assembly, the wafer transport module 102 is described. However, it should be appreciated that the description may also apply to wafer transport modules 212 and 218 of the wafer transport assembly 209. The wafer transport assembly 209 can be defined from modular components that can be assembled or disassembled to provide for ease of configuration as well as facilitating repair and replacement of individual components when necessary. In the illustrated implementation, a view of the interior of the wafer transport module 102 is provided, wherein the robot 222 is shown including an end effector 400 that is configured to engage with and support wafers being handled by the robot 222.

Also visible is the gate valve 230 that controls an opening into process module 106. The gate valve 230 can be opened for transfer of a wafer between the wafer transport module 102 and the process module 106 (e.g. for loading or unloading of a wafer from the process module), or the gate valve 230 can be closed to isolate the process module 106 from the wafer transport module 102 (e.g. during processing of a wafer). The gate valve 230 is defined along a lateral side 402 of the wafer transport module 102. The lateral side 402 of the wafer transport module 102 is configured for connection to the process module 106. The lateral side 402 of the wafer transport module 102 may further include a seal mechanism 404 that is configured to form an airtight seal when the process module 106 is attached to the wafer transport module 102. By way of example without limitation, the seal mechanism 404 may be defined by a gasket, a corresponding groove and slot, and/or any other type of mechanism that may achieve an airtight seal when the process module 106 is connected to the wafer transport module 102.

Figure 4B:
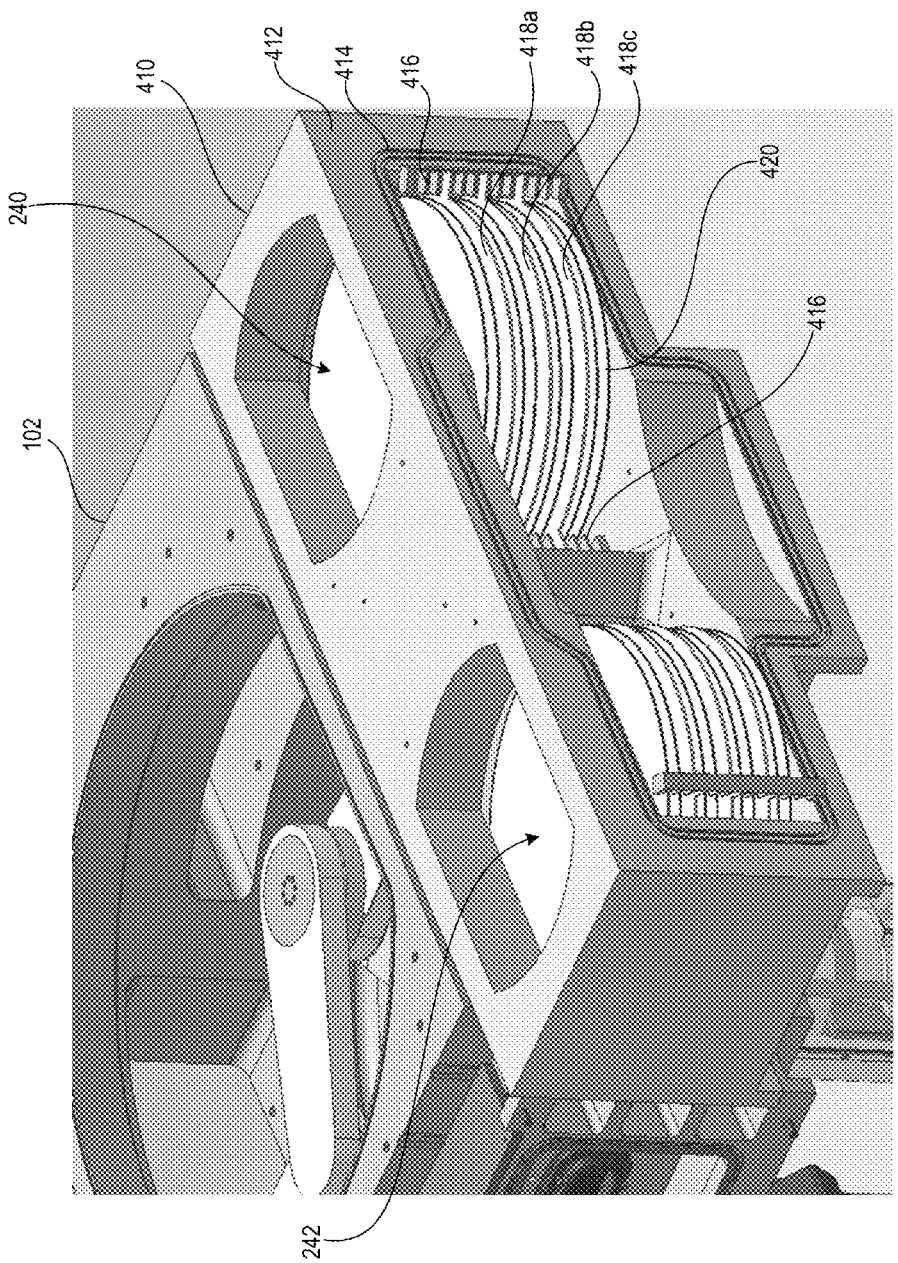
FIG. 4B illustrates a perspective view of the wafer transport module 102 with a buffer module 410 attached thereto, in accordance with implementations of the disclosure.

With continued reference to FIG. 4A, a back side 406 (facing away from the EFEM 200) of the wafer transport module 102 is also shown, the back side 406 being configured for connection to a buffer module 410 (illustrated at FIG. 4B). The back side 406 of the wafer transport module 102 may also include a seal mechanism 408 that is configured to provide an airtight seal when the buffer module 410 is attached to the wafer transport module 102.

In some implementations, such as for the wafer transport modules 212 or 218, instead of a buffer module, a back cover plate may be attached to the back side of the wafer transport module, thus defining the back side of the wafer transport assembly in such implementations. The modular components thus described provide for a system architecture of alternating wafer transport modules and buffer modules, which can be serially assembled or disassembled to define a desired configuration for a wafer transport assembly.

FIG. 4B illustrates a perspective view of the wafer transport module 102 with a buffer module 410 attached thereto, in accordance with implementations of the disclosure. A front side of the buffer module 410 (not visible in FIG. 4B) connects to the back side 406 of the wafer transport module 102, forming an airtight seal between the modules. The back side 412 of the buffer module 410 is further configured for attachment to either another wafer transport module or a back cover plate. The back side 412 of the buffer module 410 may include a seal mechanism 414 configured to form an airtight seal with the adjoining wafer transport module or back cover plate.

The buffer module 410 defines the buffer stacks 240 and 242, which are configured to store a plurality of wafers. Lateral ends of the buffer module define the aforementioned side protrusions of the wafer transport assembly. The buffer stacks share the same controlled environment that is defined for the wafer transport modules. This provides advantages in that wafers can be buffered within the system's controlled environment without requiring transfers outside of the system. This helps to limit exposure to possible contaminants and also avoids cycling of the wafers through different environments. For example, a wafer that has been processed under a vacuum condition and that is then subjected to an ambient condition might react with the ambient gases or otherwise be exposed to contaminants or particulates. Hence, the placement of buffer stacks within the controlled environment of the wafer transport system provides wafer storage sites to avoid such potential adverse effects.

Each of the buffer stacks defines a plurality of wafer storage slots, with each wafer storage slot being configured to store a single wafer (e.g. wafer 420). In the illustrated implementation, the wafer storage slots of the buffer stacks 240 are defined by support arms 416 that are configured for supporting a wafer in the buffer stack. Additionally, there may be separators defined that separate wafer storage slots from each other. It should be appreciated that in various implementations the number and arrangement of both the separators and wafer storage slots (as defined by the support arms) can vary. In the illustrated implementation, buffer stacks 240 is shown having separators 418a, 418b, and 418c, which separate four pairs of wafer storage slots. The buffer stack 240 as shown thus includes eight wafer storage slots in total. Buffer stack 242 is similarly configured to have eight wafer storage slots, with four pairs of wafer storage slots being separated by three separators.

Figure 5:
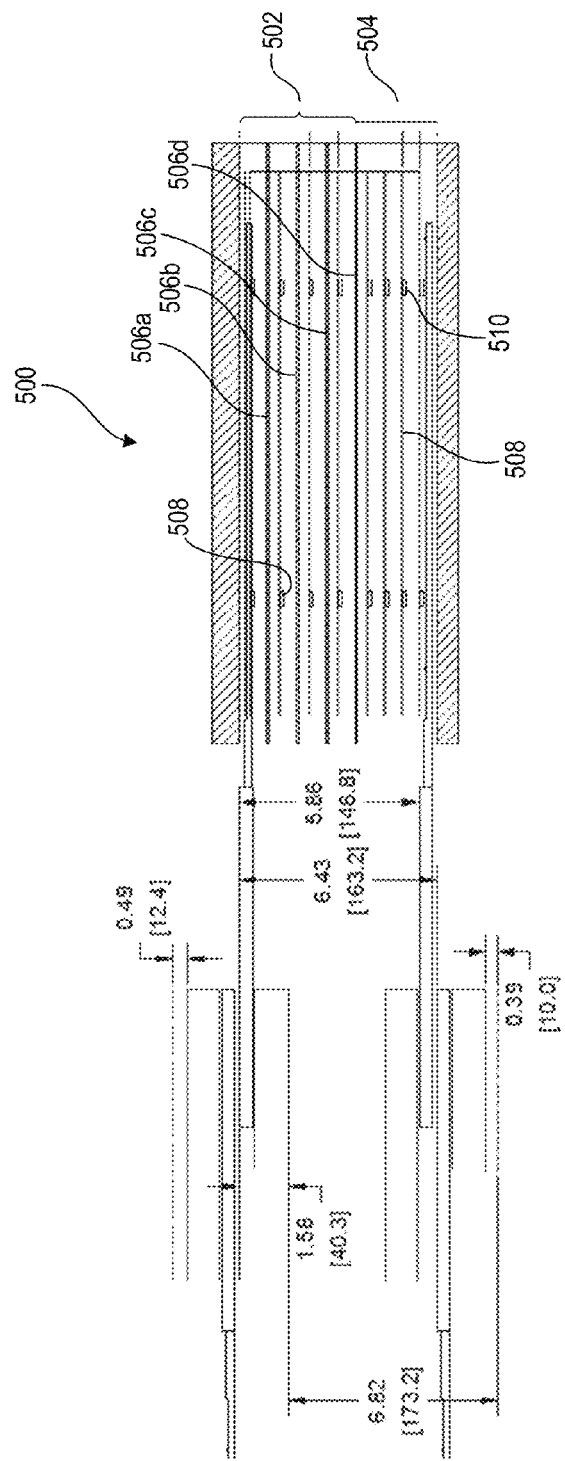
FIG. 5 conceptually illustrates a cross section view of a buffer stack 500, in accordance with implementations of the disclosure.

FIG. 5 conceptually illustrates a cross section view of a buffer stack 500, in accordance with implementations of the disclosure. The buffer stack 500 includes an upper section 502 having wafer storage slots that are separated from each other by physical partitions, and a lower section 504 having wafer storage slots that are not separated from each other by physical partitions. A given wafer storage slot is defined by a set of support arms 508 that are configured to support a wafer (e.g. wafer 510) when stored in the given wafer storage slot. The wafer storage slots of the upper section 502 are separated from each other by separators 506*a*, 506*b*, and 506*c*, and the upper section 502 is separated from the lower section 504 by a separator 506*d*. The separators define physical partitions between adjacent wafer storage slots.

In some implementations, the wafer storage slots of the upper section 502 can be utilized to store wafers that may be more sensitive or susceptible to contamination, whereas the wafer storage slots of the lower section 504 may be utilized to store wafers that are less sensitive or susceptible to contamination. In some implementations, the lower section 504 may be utilized to store wafers that are reused in the cluster tool system, such as cover wafers or seasoning wafers.

Cover wafers are used to cover the chuck of a process module during a chamber maintenance operation (e.g. in-situ clean). In conventional systems, cover wafers are typically stored outside of the wafer transport assembly under lab ambient conditions. This requires a given cover wafer to enter the wafer transport assembly through an airlock each time the cover wafer is to be used, which can be a source of unwanted particles in the system. This may be especially problematic when cover wafers are used frequently (e.g. used every lot). As the cover wafers are utilized, they are etched, and repeatedly transporting them in and out of the wafer transport assembly through the load lock is a particle source that may ultimately reduce yield or necessitate more frequent maintenance/cleaning. Thus, it is advantageous to store cover wafers in the wafer transport assembly (e.g. under vacuum condition) and so not subject the cover wafers to pressure cycles resulting from moving them in and out of the wafer transport assembly, as this will reduce the amount of contaminants entering the system.

Furthermore, in some implementations, the chemistry for chamber cleaning may be corrosive upon exposure to atmosphere/moisture. For example, when chlorine-based chemistry is applied, a cover wafer kept in vacuum might have fairly non-volatile chlorides on the surface of the cover wafer. But if the cover wafer is transported out of the wafer transport assembly into atmosphere, then the chlorides may react with moisture in the air, and may outgas and cause corrosion. Thus, by storing the cover wafers in vacuum in a buffer stack as described, then this issue is avoided, and the service life of the cover wafers may be extended.

It should be appreciated that the above discussion concerning cover wafers and particle generation/corrosion also applies to seasoning wafers which are utilized to burn in a chamber. In the illustrated implementation of FIG. 5, a lower section of the buffer stack that does not have physical partitions separating the wafer storage slots may be reserved and/or utilized for storage of cover wafers or seasoning wafers, while an upper section of the buffer stack (which may have physical partitions separating individual wafer storage slots) is reserved and/or utilized to store wafers undergoing process operations in the cluster tool system. However, it will be appreciated that in other implementations, cover or seasoning wafers may be stored in any given wafer storage slot (or section of wafer storage slots) in a buffer stack having any particular configuration of wafer storage slots and separators.

In some implementations, an entire buffer stack may be reserved and/or utilized for storage of cover/seasoning wafers. For example, with reference to the implementation of FIG. 2, buffer stack 248 and/or buffer stack 250 could be configured for storage of cover/seasoning wafers, providing dedicated buffer stack(s) for this purpose.

Figure 6:
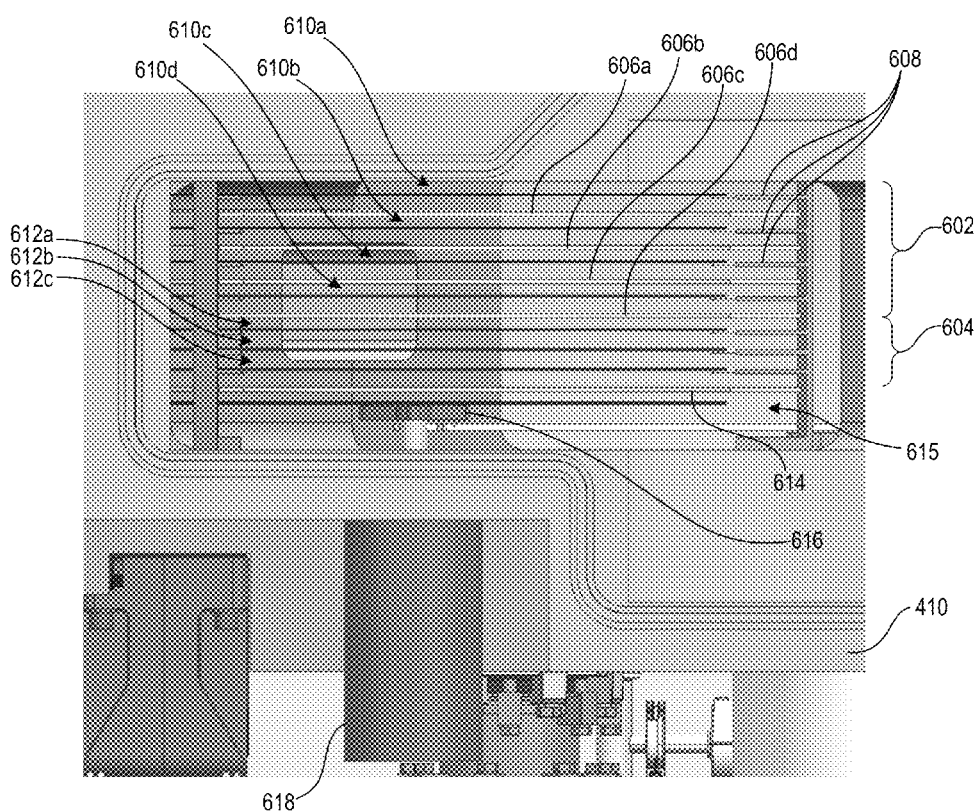
FIG. 6 illustrates a cross section view of a portion of a buffer module, showing a buffer stack, in accordance with implementations of the disclosure.

FIG. 6 illustrates a cross section view of a portion of a buffer module, showing a buffer stack, in accordance with implementations of the disclosure. The buffer stack 600 is similar to the embodiment of FIG. 5, including an upper section 602 having wafer storage slots 610*a*, 610*b*, 610*c*, and 610*d*, and a lower section 604 having wafer storage slots 612*a*, 612*b*, and 612*c*. The wafer storage slots 610*a-d* are individually partitioned by separators 606*a*, 606*b*, 606*c*, and 606*d*, whereas the wafer storage slots 612*a-c* are not individually partitioned by physical separators. In some implementations, the wafer storage slots 612*a-c* of the lower section 604 are reserved and/or utilized for storage of cover wafers, seasoning wafers, or any other type of wafer that is reused in the process modules.

The buffer stack 600 further includes a wafer storage slot 615 positioned below the lower section 604, and partitioned therefrom by a separator 614. The wafer storage slot 615 includes a wafer orienter 616 that is capable of supporting and rotating a wafer placed thereon. It will be appreciated that as a given wafer is transported throughout a wafer transport assembly in accordance with embodiments of the disclosure, the rotational orientation of the wafer will change. For some process modules it may be desirable to place the wafer into the process module in a specific rotational orientation. Therefore, it is useful to have a wafer orienter integrated into the buffer stack to rotate a given wafer so that it will have the specific rotational orientation that is desired for the process module. In some implementations, the wafer orienter 616 further includes an actuator 618 that extends below the main housing of the buffer module 410. The actuator 618 is configured to drive the rotation of the wafer orienter 616.

Figure 7:
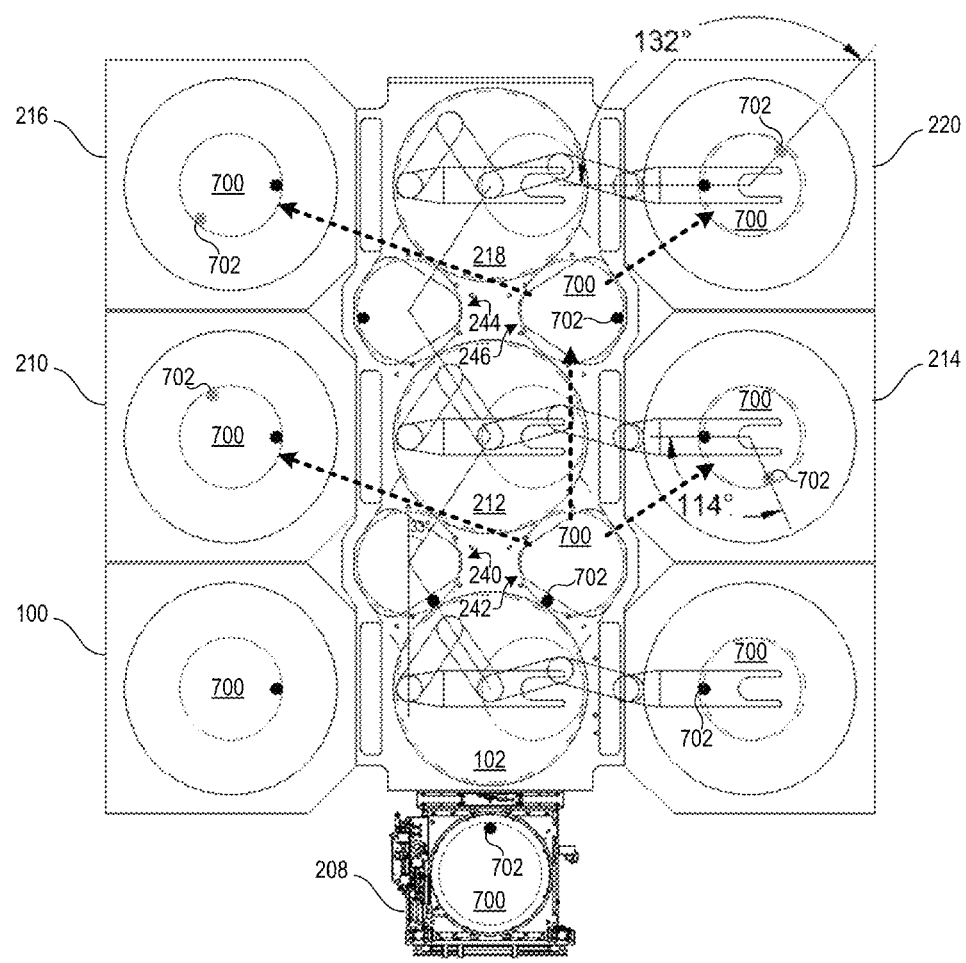
FIG. 7 illustrates a cluster tool system, highlighting the orientation of a wafer as it is moved through various components of the system, in accordance with implementations of the disclosure.

FIG. 7 illustrates a cluster tool system, highlighting the orientation of a wafer as it is moved through various components of the system, in accordance with implementations of the disclosure. The illustrated system is similar to the implementation of FIG. 2, including wafer transport modules 102, 212, and 218, as well as buffer stacks 240, 242, 244, and 246, collectively defining a wafer transport assembly.

In the illustrated implementation, the buffer stacks are canted by 33 degrees. That is, the center of each buffer stack deviates by 33 degrees from a vector defined from the center of an adjacent wafer transport module to the center of another adjacent wafer transport module. For example, if a vector is defined from the center of wafer transport module 102 to the center of wafer transport module 212, then the centers of buffer stacks 240 and 242 each deviate by 33 degrees from such a the vector. Because the buffer stacks are canted, in the absence of any active rotation of a given wafer within the system, the wafer's rotational orientation will change as it is moved through the buffer stacks and may be different from one process module to the next.

With continued reference to FIG. 7, additionally shown is a wafer 700 having a notch whose location is conceptually shown by the dot indicated at reference 702. By way of example, in the illustrated implementation, the wafer 700 is shown entering the wafer transport assembly through the airlock 208, the wafer 700 at this stage having its notch aligned in the longitudinal direction oriented towards the rear of the wafer transport assembly. From this location, when the wafer 700 is moved by the wafer transport module 102 into the process module 106, then the wafer rotates 90 degrees counterclockwise, such that the notch becomes oriented in the lateral direction towards the opening of the process module 106. In some implementations, this is the desired orientation for the wafer when in the process module 106, and thus no additional rotation of the wafer or reconfiguration of the process module is required. Following processing in the process module 106, the wafer 700 may be moved by the wafer transport module 102 to the buffer stack 242, which causes the wafer to rotate an additional 57 degrees counterclockwise. It will be appreciated that the notch is oriented towards the center of the wafer transport module 102 when it is being handled by the wafer transport module 102 and moved between any of the load lock 208, the process module 100 or 106, and the buffer stacks 240 or 242.

From the buffer stack 242, if the wafer 700 is moved by the wafer transport module 212 to the process module 214, then the wafer 700 rotates counterclockwise by an additional 57 degrees. This means that the notch deviates by 114 degrees counterclockwise from a vector defined from the center of the wafer 700 to the center of the wafer transport module 212. As the desired orientation of the wafer 700 for the process module 214 may be no deviation from the vector as defined, then rotation of the wafer 700 prior to entering the process module 214 may be desirable. For example, a wafer orienter integrated into the buffer stack 242 may be configured to rotate the wafer 700 by 114 degrees in a clockwise direction, so as to provide for the wafer 700 to be aligned in the desired orientation when transported into the process module 214.

In a similar fashion, if from the buffer stack 242 the wafer 700 as shown is moved into the process module 210, then the wafer 700 rotates clockwise by 123 degrees. This may again result in the wafer orientation deviating by 114 degrees counterclockwise from the desired orientation for the process module 210. Similarly, a wafer orienter integrated into the buffer stack 242 may be configured to rotate the wafer 700 by 114 degrees in a clockwise direction, so as to provide for the wafer 700 to be aligned in the desired orientation (the notch oriented towards the center of the wafer transport module 212) when transported into the process module 210.

From the process module 214, if the wafer 700 as shown is then moved by the wafer transport module 212 to the buffer stack 246, then the wafer 700 is rotated clockwise by 57 degrees. It will be appreciated that if the wafer 700 as shown is moved by the wafer transport module 212, from either of the buffer stack 242 or the process module 210, to the buffer stack 246, then the wafer 700 will achieve the same orientation. If the wafer 700 is then moved by the wafer transport module 218 from the buffer stack 246 to the process module 220, then the wafer 700 will be rotated by an additional 57 degrees, meaning that the orientation of the notch will deviate by 132 degrees clockwise from a vector defined from the center of the wafer 700 to the center of the wafer transport module 218. If the wafer 700 is moved by the wafer transport module 218 from the buffer stack 246 to the process module 216, then the wafer 700 will be rotated by 123 degrees clockwise, again meaning that the orientation of the notch will deviate by 132 degrees clockwise from a vector defined from the center of the wafer 700 to the center of the wafer transport module 218. A wafer orienter may be included in the buffer stack 246 to rotate wafers during processing as needed to ensure optimal rotational orientation when transported into the process modules.

Though in the foregoing discussion, the buffer stacks are described as being canted by 33 degrees, it will be appreciated that in other implementations, the buffer stacks are canted by angles ranging from about 30 to 35 degrees. In still other implementations, the buffer stacks are canted by angles ranging from about 25 to 40 degrees. The concepts discussed above regarding the rotation of the wafer during transport in the system apply regardless of the specific angle by which the buffer stacks are canted, and the specific orientation of the wafer at any given location in the system will be apparent to those skilled in the art.

In implementations of the disclosure, the wafer transport assembly can include several buffer stacks that are configurable to be used for various purposes, and which aid in providing throughput advantages over prior art systems. The buffer stacks can be utilized to define pathways for wafers. For example, in some implementations, at least some wafer storage slots in at least some of the buffer stacks in a given wafer transport assembly are configured so that wafers move through a given buffer stack only once. In some implementations, the system is configured so that wafers enter a given buffer stack from one side and exit the buffer stack from another side. For example, with continued reference to FIG. 7, the buffer stack 242 might be configured so that wafers enter from the side of the buffer stack 242 facing the wafer transport module 102 (the front-facing side), and exit from the side facing the wafer transport module 212 (the rear-facing side). In this manner, wafers move from the wafer transport module 102 to the wafer transport module 212 via transport in a one-way fashion through the buffer stack 242. By having wafers move through the buffer stacks in a one-way fashion, wafers do not return to the same buffer stack, and the possibility for cross-contamination from different processes is reduced.

Extending the concept with continued reference to FIG. 7, the buffer stacks 242 and 246 might be configured so that wafers move through each of them from the front-facing side to the rear-facing side, whereas the buffer stacks 244 and 240 are configured so that wafers move through each of them in the opposite manner, from the rear-facing side to the front-facing side. Conceptually, the wafer transport modules and the buffer stacks thus define a pathway for wafers through the wafer transport assembly and/or the cluster tool system.

By way of example without limitation, a pathway can be defined for a wafer from the loadlock 700, to the wafer transport module 102, to the buffer stack 242, to the wafer transport module 212, to either of the process modules 210 or 214, to the wafer transport module 212, to the buffer stack 240, to the wafer transport module 102, to the loadlock 208.

As another example, a pathway can be defined for a wafer from the loadlock 700, to the wafer transport module 102, to the buffer stack 242, to the wafer transport module 212, to the buffer stack 246, to either of the process modules 216 or 220, to the wafer transport module 218, to the buffer stack 244, to the wafer transport module 212, to the buffer stack 240, to the wafer transport module 102, to the loadlock 208.

In some implementations, certain buffer stacks are designated as input buffer stacks utilized for temporary storage of wafers that are to be transported to a process module for processing, whereas other buffer stacks are designated as output buffer stacks utilized for temporary storage of wafers that have been processed and which are to be transported out of the system. For example, in the illustrated implementation, the buffer stacks 242 and 246 might be designated as input buffer stacks, whereas the buffer stacks 240 and 244 might be designated as output buffer stacks. This allows for the input path of a wafer to be separately defined from the output path for the wafer, which can aid in the avoidance of cross-contamination and bottlenecks.

The above discussion concerning the pathways and usage of buffer stacks is provided by way of example without limitation. It should be appreciated that the buffer stacks of the present disclosure, which are defined in the same controlled environment (e.g. vacuum) as the wafer transport modules, can be flexibly deployed and utilized in any suitable manner to achieve efficient storage and movement of wafers through the cluster tool system.

Figure 8:
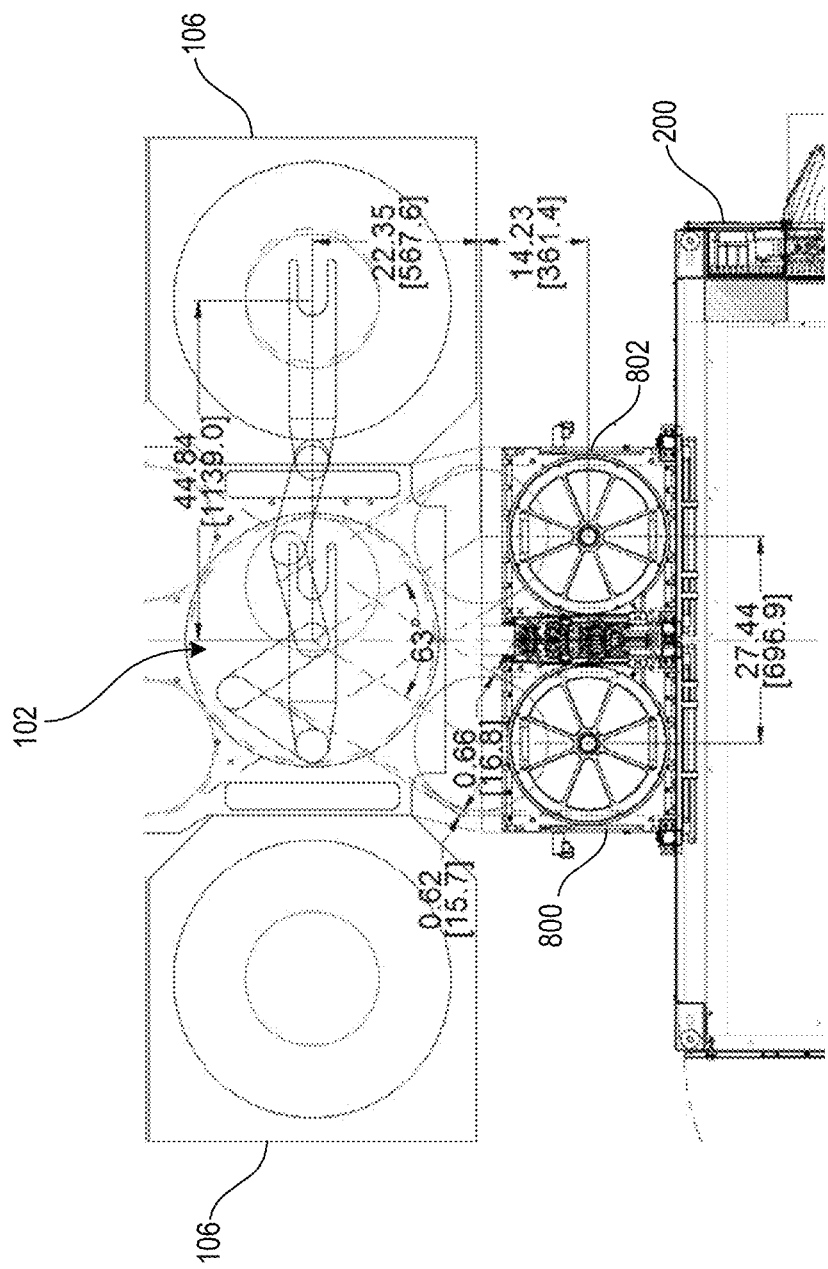
FIG. 8 illustrates a cross section view of a portion of a cluster tool system, in accordance with implementations of the disclosure.

FIG. 8 illustrates a cross section view of a portion of a cluster tool system, in accordance with implementations of the disclosure. In the illustrated implementation, a pair of load locks 800 and 802 are arranged in a side-by-side configuration and connected between the wafer transport module 102 and the EFEM 200. Each of load locks 800 and 802 may be a dual slot load lock, each having two slots that can be utilized for wafer transfer between the EFEM and the wafer transport module 102. In such a configuration, the load locks together provide the capacity to handle four wafers simultaneously. In some implementations, one of the load locks can be utilized for wafers entering the wafer transport assembly, whereas one of the load locks can be utilized for wafers exiting the wafer transport assembly.

Figure 9:
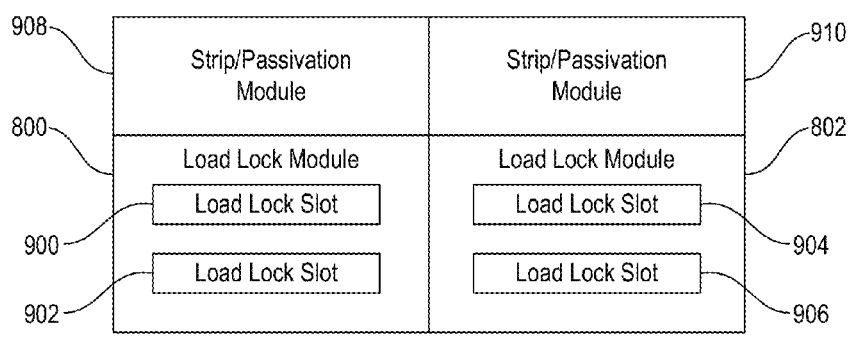
FIG. 9 conceptually illustrates a configuration of load locks with integrated post-processing modules, in accordance with implementations of the disclosure.

FIG. 9 conceptually illustrates a configuration of load locks with integrated post-processing modules, in accordance with implementations of the disclosure. The load locks 800 and 802 are arranged in a side-by-side configuration. Load lock 800 includes slots 900 and 902, and load lock 802 includes slots 904 and 906, each of the slots being configured for transfer of a wafer into or out of the wafer transport assembly.

Additionally, post-processing modules 908 and 910 are vertically stacked with the load locks 800 and 802, respectively. In various implementations, the post-processing modules can be configured to perform a post-processing operation on a processed wafer, such as a strip operation or a passivation operation. In the illustrated implementation, the post-processing modules 908 and 910 are positioned above the load locks 800 and 802, respectively, but in other implementations, the post-processing modules 908 and 910 can be positioned below the load locks 800 and 802, respectively. The post-processing modules 908 and 910 can be configured to perform a strip or passivation operation on a processed wafer, prior to the processed wafer exiting the wafer transport assembly. The post-processing modules 908 and 910 open to the interior of the wafer transport assembly.

Thus by way of example, with reference to the system of FIG. 2, a processed wafer may be placed into one of the post-processing modules by the wafer transport module 102. After completion of the post-processing (e.g. strip or passivation) operation, the wafer is removed from the post-processing module by the wafer transport module 102, and placed into a wafer slot in one of the load locks 800 or 802, to be transported out of the wafer transport assembly 209 to the EFEM 200.

It should be appreciated that implementations of the present disclosure are applicable to any of various sizes of substrates, including 200 mm, 300 mm, and 450 mm substrates, and non-standard sizes and shapes, including square substrates.

Figure 10:
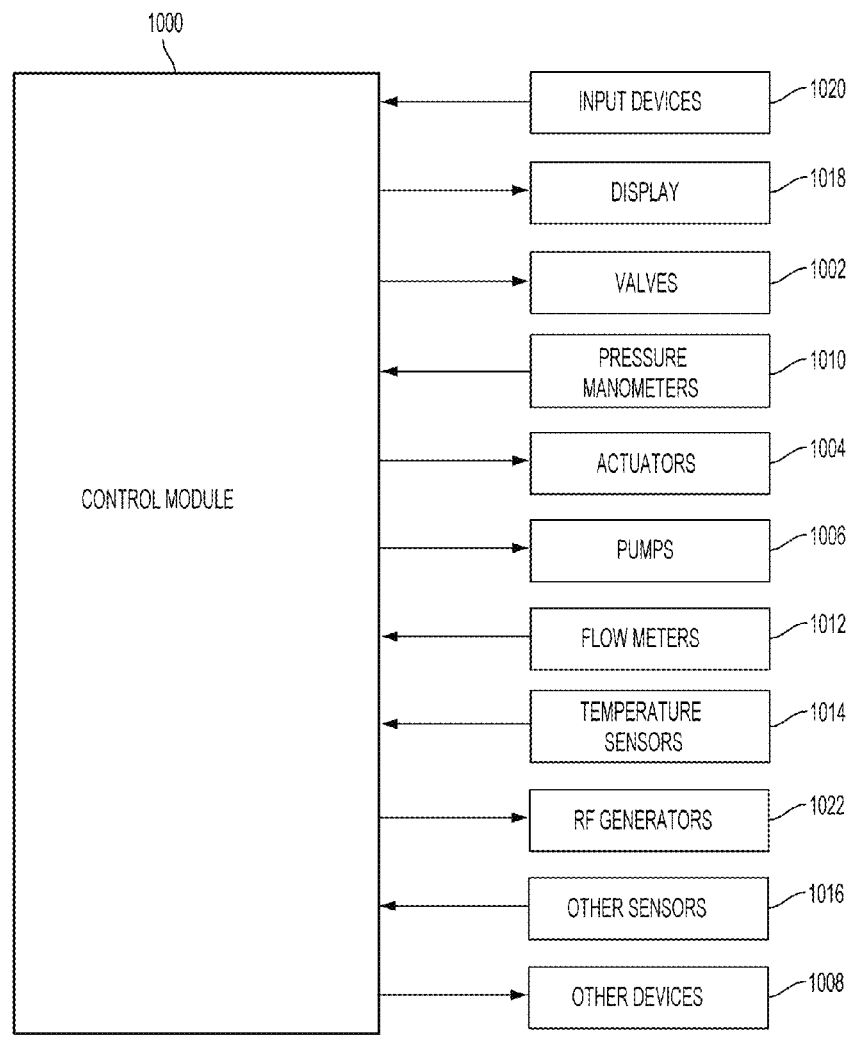
FIG. 10 shows a control module for controlling the systems of the present disclosure.

FIG. 10 shows a control module 1000 for controlling the systems described above. For instance, the control module 1000 may include a processor, memory and one or more interfaces. The control module 1000 may be employed to control devices in the system in accordance with predefined programming and based in part on sensed values, including any of the aforementioned components of a cluster tool system, including without limitation, an EFEM, a load lock, a post-processing module, a wafer transport module, a wafer orienter, and a process module. It should be appreciated that the control module 1000 may control any type of operation for which a given component is defined or capable of performance, in accordance with implementations of the disclosure.

For example only, the control module 1000 may control one or more of valves 1002, actuators 1004, pumps 1006, RF generators 1022, and other devices 1008 based on the sensed values, predefined programming/instructions and other control parameters. The control module 1000 receives the sensed values from, for example only, pressure manometers 1010, flow meters 1012, temperature sensors 1014, and/or other sensors 1016.

With respect to a given process module, the control module 1000 may also be employed to control process conditions during reactant/precursor delivery and plasma processing. The control module 1000 will typically include one or more memory devices and one or more processors.

The control module 1000 may control activities of the reactant/precursor delivery system and plasma processing apparatus. The control module 1000 executes computer programs including sets of instructions for controlling process timing, delivery system temperature, pressure differentials across the filters, valve positions, mixture of gases, chamber pressure, chamber temperature, wafer temperature, RF power levels, wafer chuck or pedestal position, and other parameters of a particular process. The control module 1000 may also monitor the pressure differential and automatically switch vapor precursor delivery from one or more paths to one or more other paths. Other computer programs stored on memory devices associated with the control module 1000 may be employed in some embodiments.

Typically there will be a user interface associated with the control module 1000. The user interface may include a display 1018 (e.g. a display screen and/or graphical software displays of the apparatus and/or process conditions), and user input devices 1020 such as pointing devices, keyboards, touch screens, microphones, etc.

Computer programs for controlling delivery of precursor, plasma processing and other processes in a process sequence can be written in any conventional computer readable programming language: for example, assembly language, C, C++, Pascal, Fortran or others. Compiled object code or script is executed by the processor to perform the tasks identified in the program.

The control module parameters relate to process conditions such as, for example, filter pressure differentials, process gas composition and flow rates, temperature, pressure, plasma conditions such as RF power levels and the low frequency RF frequency, cooling gas pressure, and chamber wall temperature.

The system software may be designed or configured in many different ways. For example, various chamber component subroutines or control objects may be written to control operation of the chamber components necessary to carry out the inventive deposition processes. Examples of programs or sections of programs for this purpose include substrate positioning code, process gas control code, pressure control code, heater control code, and plasma control code.

A substrate positioning program may include program code for controlling chamber components that are used to load the substrate onto a pedestal or chuck and to control the spacing between the substrate and other parts of the chamber such as a gas inlet and/or target. A process gas control program may include code for controlling gas composition and flow rates and optionally for flowing gas into the chamber prior to deposition in order to stabilize the pressure in the chamber. A filter monitoring program includes code comparing the measured differential(s) to predetermined value(s) and/or code for switching paths. A pressure control program may include code for controlling the pressure in the chamber by regulating, e.g., a throttle valve in the exhaust system of the chamber. A heater control program may include code for controlling the current to heating units for heating components in the precursor delivery system, the substrate and/or other portions of the system. Alternatively, the heater control program may control delivery of a heat transfer gas such as helium to the wafer chuck.

Examples of sensors that may be monitored during processing include, but are not limited to, mass flow control modules, pressure sensors such as the pressure manometers 1010, and thermocouples located in delivery system, the pedestal or chuck (e.g. the temperature sensors 1014). Appropriately programmed feedback and control algorithms may be used with data from these sensors to maintain desired process conditions. The foregoing describes implementation of embodiments of the invention in a single or multi-chamber semiconductor processing tool.

The foregoing description of the embodiments has been provided for purposes of illustration and description. It is not intended to be exhaustive or to limit the invention. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the invention, and all such modifications are intended to be included within the scope of the invention.

Although the foregoing embodiments have been described in some detail for purposes of clarity of understanding, it will be apparent that certain changes and modifications can be practiced within the scope of the appended claims. Accordingly, the present embodiments are to be considered as illustrative and not restrictive, and the embodiments are not to be limited to the details given herein, but may be modified within their scope and equivalents of the claims.

What is claimed is:

1. A cluster tool system for processing wafers, comprising:
   a wafer transport assembly extending along a longitudinal axis of the cluster tool system, the wafer transport assembly having a front end oriented towards an equipment front end module (EFEM), the wafer transport assembly having a rear end opposite the front end;
   at least two process modules coupled to the wafer transport assembly along a first lateral side of the wafer transport assembly, the wafer transport assembly being configured to transport wafers to and from the at least two process modules coupled along the first lateral side;
   at least two process modules coupled to the wafer transport assembly along a second lateral side of the wafer transport assembly, the wafer transport assembly being configured to transport wafers to and from the at least two process modules coupled along the second lateral side;
   a service tunnel defined underneath the wafer transport assembly, the service tunnel extending along the longitudinal axis of the cluster tool system from the front end to the rear end of the wafer transport assembly, the service tunnel having a vertical dimension defined between an underside of the wafer transport assembly and a service floor that is positioned underneath the wafer transport assembly, the service floor being defined at a height that is less than a height of a fabrication facility floor in which the cluster tool system is disposed.

2. The cluster tool system of claim 1, wherein the wafer transport assembly includes at least two wafer transport modules that are coupled to each other along the longitudinal axis, wherein each of the wafer transport modules couples to one of the process modules that is coupled along the first lateral side of the wafer transport assembly, and wherein each of the wafer transport modules couples to one of the process modules that is coupled along the second lateral side of the wafer transport assembly.

3. The cluster tool system of claim 1, further comprising:
   at least two process module frames configured to support the at least two process modules coupled along the first lateral side of the wafer transport assembly, and further configured to rest on the fabrication facility floor;
   at least two process module frames configured to support the at least two process modules coupled along the second lateral side of the wafer transport assembly, and further configured to rest on the fabrication facility floor.

4. The cluster tool system of claim 1, wherein a stair set is defined at a rear end of the service tunnel that is defined substantially underneath the rear end of the wafer transport assembly, the stair set configured to define a path from the fabrication floor down to the service floor.

5. The cluster tool system of claim 1, wherein the height of the service floor is approximately 1 feet (30.5 cm) to 2 feet (61 cm) below the height of the fabrication facility floor.

6. The cluster tool system of claim 1, wherein the front side of the wafer transport assembly is configured for connection to a load lock that controls access to and from the EFEM, wherein a front end of the service tunnel extends substantially to the EFEM.

7. The cluster tool system of claim 1, wherein a height of the service tunnel is approximately 6 feet (183 cm) to 8 feet (244 cm).

8. The cluster tool system of claim 1, wherein a first lateral side of the service tunnel provides access to the process modules coupled along the first lateral side of the wafer transport assembly, and a second lateral side of the service tunnel provides access to the process modules coupled along the second lateral side of the wafer transport assembly.

9. The cluster tool system of claim 8, wherein the first lateral side of the service tunnel provides access to one or more gas boxes defined for the process modules coupled along the first lateral side of the wafer transport assembly, and the second lateral side of the service tunnel provides access to one or more gas boxes defined for the process modules coupled along the second lateral side of the wafer transport assembly.

10. The cluster tool system of claim 1, wherein the service tunnel is compliant with SEMI E72 standards.

11. A cluster tool system for processing wafers, comprising:
    a wafer transport assembly extending along a longitudinal axis of the cluster tool system, the wafer transport assembly having a front end oriented towards an equipment front end module (EFEM), the wafer transport assembly having a rear end opposite the front end;
    at least two process modules coupled to the wafer transport assembly along a first lateral side of the wafer transport assembly, the wafer transport assembly being configured to transport wafers to and from the at least two process modules coupled along the first lateral side;

at least two process modules coupled to the wafer transport assembly along a second lateral side of the wafer transport assembly, the wafer transport assembly being configured to transport wafers to and from the at least two process modules coupled along the second lateral side;

a service tunnel defined underneath the wafer transport assembly, the service tunnel extending along the longitudinal axis of the cluster tool system from the front end to the rear end of the wafer transport assembly, the service tunnel having a vertical dimension defined between an underside of the wafer transport assembly and a service floor that is positioned underneath the wafer transport assembly, the service floor being defined at a height that is less than a height of a fabrication facility floor in which the cluster tool system is disposed, wherein the height of the service floor is approximately 1 feet (30 cm) to 2 feet (60 cm) below the height of the fabrication facility floor;

at least two process module frames configured to support the at least two process modules coupled along the second lateral side of the wafer transport assembly, and further configured to rest on the fabrication facility floor;

at least two process module frames configured to support the at least two process modules coupled along the second lateral side of the wafer transport assembly, and further configured to rest on the fabrication facility floor;

wherein a height of the service tunnel is defined by the height of the service floor and a height of the process module frames, the height of the service tunnel being approximately 6 feet (180 cm) to 8 feet (240 cm).

12. The cluster tool system of claim 11, wherein the wafer transport assembly includes at least two wafer transport modules that are coupled to each other along the longitudinal axis, wherein each of the wafer transport modules couples to one of the process modules that is coupled along the first lateral side of the wafer transport assembly, and wherein each of the wafer transport modules couples to one of the process modules that is coupled along the second lateral side of the wafer transport assembly.

13. The cluster tool system of claim 11, wherein a stair set is defined at a rear end of the service tunnel that is defined substantially underneath the rear end of the wafer transport assembly, the stair set configured to define a path from the fabrication floor down to the service floor.

14. The cluster tool system of claim 11, wherein the front side of the wafer transport assembly is configured for connection to a load lock that controls access to and from the EFEM, wherein a front end of the service tunnel extends substantially to the EFEM.

15. The cluster tool system of claim 11, wherein a first lateral side of the service tunnel provides access to the process modules coupled along the first lateral side of the wafer transport assembly, and a second lateral side of the service tunnel provides access to the process modules coupled along the second lateral side of the wafer transport assembly.

16. The cluster tool system of claim 15, wherein the first lateral side of the service tunnel provides access to one or more gas boxes defined for the process modules coupled along the first lateral side of the wafer transport assembly, and the second lateral side of the service tunnel provides access to one or more gas boxes defined for the process modules coupled along the second lateral side of the wafer transport assembly.

17. The cluster tool system of claim 11, wherein the service tunnel is compliant with SEMI E72 standards.

\* \* \* \* \*